United States Patent

Kishi et al.

[11] Patent Number: 5,824,561
[45] Date of Patent: Oct. 20, 1998

[54] THERMOELECTRIC DEVICE AND A METHOD OF MANUFACTURING THEREOF

[75] Inventors: Matsuo Kishi; Hirohiko Nemoto; Hiroshi Okano, all of Chiba, Japan

[73] Assignee: Seiko Instruments Inc., Japan

[21] Appl. No.: 445,168

[22] Filed: May 19, 1995

[30] Foreign Application Priority Data

| May 23, 1994 | [JP] | Japan | ................................... 6-108757 |
| Jun. 3, 1994 | [JP] | Japan | ................................... 6-122873 |
| Jul. 29, 1994 | [JP] | Japan | ................................... 6-178987 |
| Apr. 7, 1995 | [JP] | Japan | ................................... 7-082906 |

[51] Int. Cl.$^6$ ................................................. H01L 21/60
[52] U.S. Cl. .......................... 437/209; 437/211; 437/214; 437/182
[58] Field of Search ..................... 437/182, 183, 437/203, 209, 211, 214, 217, 219; 257/742, 743, 777, 778

[56] References Cited

U.S. PATENT DOCUMENTS 4,845,542  7/1989  Bezuk et al. ............................. 257/777
5,523,628  6/1996  Williams et al. ......................... 257/778

Primary Examiner—Kevin M. Picardat
Attorney, Agent, or Firm—Adams & Wilks

[57] ABSTRACT

A method of making a thermoelectric device comprises forming electrodes on a surface of a first substrate and on a surface of a second substrate. Thereafter, a P-type thermoelectric material plate is bonded to the surface of the first substrate having the electrodes, and an N-type thermoelectric material plate is bonded to the surface of the second substrate having the electrodes. Each of the thermoelectric material plates are then processed by cutting and removing portions thereof to form P-type and N-type thermoelectric material chips bonded to the first and second substrates, respectively. Thereafter, the N-type thermoelectric material chips of the second substrate are bonded to the electrodes of the first substrate, and the P-type thermoelectric material chips of the first substrate are bonded to the electrodes of the second substrate to form PN-junctions between the first and second substrates.

25 Claims, 18 Drawing Sheets

CROSS SECTION ALONG THE LINE A-A' OF FIG.1.

CROSS SECTION ALONG THE LINE B-B' OF FIG.1.

BUMP FORMING STEP

ELECTRODE FORMING STEP

FIG. 4C  BONDING STEP

FIG. 4D  CUTTING AND ELIMINATING STEP

FIG. 4E  INTEGRATING STEP

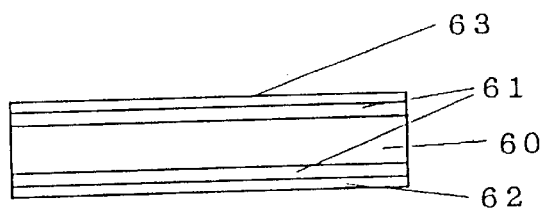
FIG. 6A  BONDING LAYER FORMING STEP
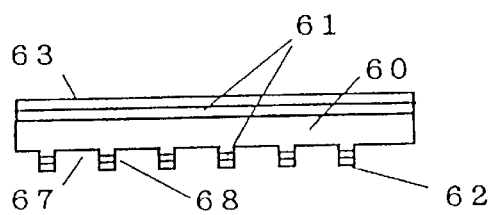
FIG. 6B
GROOVING STEP
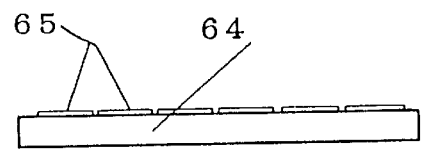
FIG. 6C
ELECTRODE FORMING STEP
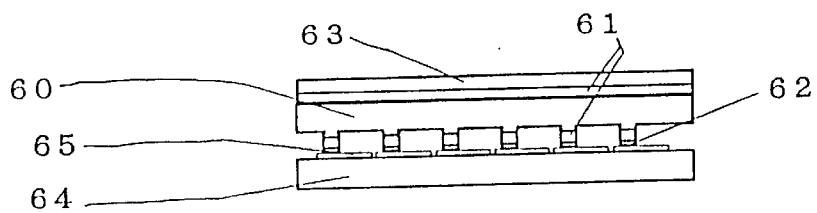
FIG. 6D
BONDING STEP
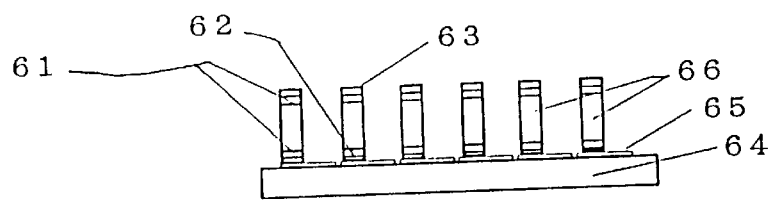
FIG. 6E
CUTTING AND ELIMINATING STEP
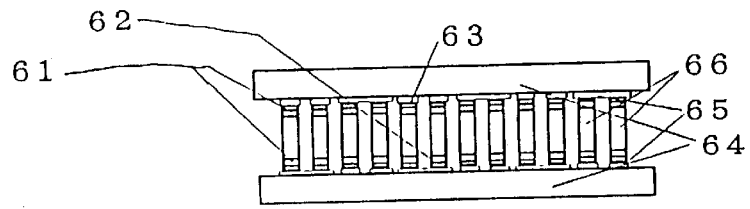
FIG. 6F  INTEGRATING STEP

BUMP FORMING STEP

ELECTRODE FORMING STEP

BONDING STEP

CUTTING AND ELIMINATING STEP

INTEGRATING STEP

BUMP FORMING STEP

GROOVING STEP

ELECTRODE FORMING STEP

BONDING STEP

CUTTING AND ELIMINATING STEP

INTEGRATING STEP

CROSS SECTION OF THE P-TYPE THERMOELECTRIC MATERIAL WAFER AFTER THE GROOVING STEP.

CROSS SECTION OF THE N-TYPE THERMOELECTRIC MATERIAL WAFER AFTER THE GROOVING STEP.

CROSS SECTION OF THE P-TYPE THERMOELECTRIC MATERIAL
CHIPS AND SUBSTRATE AFTER THE CUTTING AND ELIMINATING STEP.

CROSS SECTION OF THE N-TYPE THERMOELECTRIC MATERIAL CHIPS
AND SUBSTRATE AFTER THE CUTTING AND ELIMINATING STEP.

PROTRUDED ELECTRODE FORMING STEP

ELECTRODE FORMING STEP

BONDING STEP

CUTTING AND ELIMINATING STEP

INTEGRATING STEP

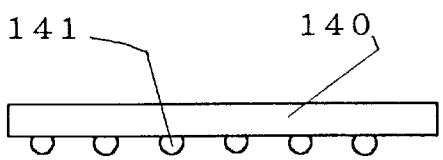
FIG. 14A
BUMP FORMING STEP
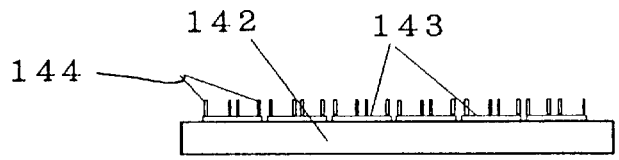
FIG. 14B
ELECTRODE FORMING STEP
FIG. 14C
BONDING STEP
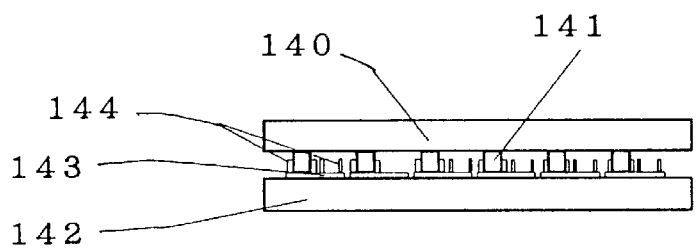
FIG. 14D
CUTTING AND ELIMINATING STEP
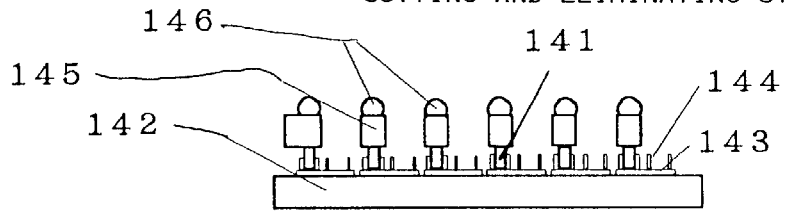
FIG. 14E
INTEGRATING STEP
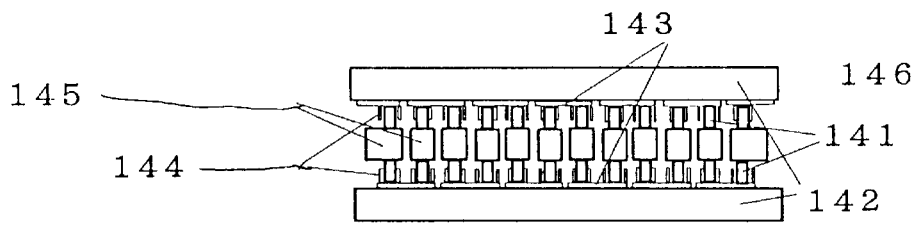

RELATIONSHIP BETWEEN ARRANGEMENT OF THERMOELECTRIC MATERIAL CHIPS AND ELECTRODES OF A CONVENTIONAL DEVICE.

LONGITUDINAL SECTION ALONG LINE X1-X1' SHOWN IN FIG. 16A.

LONGITUDINAL SECTION ALONG LINE X2-X2' SHOWN IN FIG. 16A.

LONGITUDINAL SECTION ALONG LINE Y1-Y1' SHOWN IN FIG. 16A.

CROSS SECTION OF THE THERMOELECTRIC MATERIAL WAFER.

CROSS SECTION OF THE THERMOELECTRIC MATERIAL WAFER
WITH PLATING LAYER FOR SOLDERING.

CROSS SECTION OF THE THERMOMATERIAL CHIPS
WITH THE LAYERS FOR SOLDERING.

A STATE OF SUBSTRATES AND THERMOELECTRIC MATERIAL CHIPS BEFORE BONDING.

CROSS SECTION OF THE THERMOELECTRIC DEVICE FORMED BY BONDING THE RESPECTIVE PORTIONS.

THERMOELECTRIC DEVICE AND A METHOD OF MANUFACTURING THEREOF

BACKGROUND OF THE INVENTION

1. [Field of the Invention]

The present invention relates to a thermoelectric device and a method of making thereof which make possible electric generation by temperature difference (thermal power generation) by the Seebeck effect and thermoelectric cooling and heat generation by the Peltier effect.

2. [Prior Art]

A thermoelectric device is made by bonding a P-type thermoelectric material and a N-type thermoelectric material via an electrically conductive electrode such as a metal to thereby form a couple of PN junctions. The thermoelectric device generates thermal electromotive force based on the Seebeck effect by a temperature difference applied between ends of the junction couple. Therefore, it has applications for a power generating device and conversely, a cooling device and a fine temperature control device utilizing the so-called Peltier effect in which one side of a junction is cooled and the other side generates heat by making electric current flow in the device and the like.

Generally, a thermoelectric device is used as a module in which a plurality of couples of PN junctions are connected in series to promote its function. In the structure of this module pieces of P-type and N-type thermoelectric materials (called thermoelectric material chip) having a shape of a rectangular parallelopiped of which size ranges from several hundred $\mu$m to several mm are interposed by two sheets of electrically insulative substrates of alumina, aluminium nitride or the like, the P-type thermoelectric material chips and N-type thermoelectric material chips are PN-coupled by electrodes of an electrically conductive substance such as a metal formed on the substrates and at the same time the thermoelectric material chips are connected in series by these junctions.

FIG. 16 illustrates views showing an arrangement of electrodes of substrates and thermoelectric material chips at a section cut in a direction in parallel with the substrates and respective sections in a direction orthogonal to the substrates of a conventional thermoelectric device (hereinafter called a thermoelectric device including a module in which the above-mentioned plurality of thermoelectric chips are arranged) having such a structure. FIG. 16A is a view showing an arrangement of electrodes and thermoelectric material chips on the substrate at a section in parallel with the substrates of the conventional thermoelectric device. In other words, it is a perspective view for indicating the arrangement of the electrodes and the thermoelectric material chips from above the substrate. An electrode pattern shown by bold lines indicates an electrode 161 of a top substrate whereas an electrode pattern shown by dotted lines indicates an electrode 162 of a bottom substrate. Further, a hatched quadrangle at the inside of a portion in which the electrode 161 of the top substrate intersects with the electrode 162 of the bottom substrate indicates a portion in which a P-type thermoelectric material chip 163 or a N-type thermoelectric material chip 164 is disposed. FIGS. 16B, 16C, 16D are views showing respective longitudinal sections of FIG. 16A taken along lines X1—X1', X2—X2' and Y1—Y1'. As is apparent from FIG. 16, the arrangement of the thermoelectric material chips in the conventional thermoelectric device is in a lattice form arranged on the substrate and the P-type thermoelectric material chips and the N-type thermoelectric material chips are always arranged alternately in respective rows (X direction and Y direction in FIG. 16A) constituting the lattice.

An explanation will be given of a method of making the conventional thermoelectric device comprising a plurality of the thermoelectric material chips as follows.

FIG. 17 illustrates views showing an outline of working thermoelectric material in manufacturing the conventional thermoelectric device by longitudinal sections thereof. FIG. 17A shows a section of a thermoelectric material 171 which has been worked in plate-like form or rod-like form. Layers 172 are formed for soldering by Ni etc. on both faces of the thermoelectric material to be bonded to the substrates by a plating method (FIG. 17B). Next, P-type and N-type thermoelectric material chips 173 each having the layers 172 for soldering on its both faces are formed by cutting the thermoelectric material (FIG. 17C).

Successively, each of the thermoelectric material chips formed as above is disposed on a predetermined electrode on the substrate by using jigs or the like and a bonding is performed thereby forming the thermoelectric device. FIG. 18 illustrates views showing a conventional method of manufacturing a thermoelectric device by using the thermoelectric material chips and substrates provided with electrodes. FIG. 18A shows relationship between the substrates 181 and thermoelectric material chips 182 before bonding. Electrodes 183 for forming PN junctions and bonding materials 184 for bonding the thermoelectric material chips 182 to surfaces of the substrates are formed on the substrates 181 in layers. FIG. 18B shows a longitudinal sectional view in which a thermoelectric device 185 is formed by bonding the respective portions.

Each thermoelectric material chip used for a thermoelectric device is a rectangular parallelopiped having sides with a size ranging from several hundred $\mu$m to several mm. However, in recent years, in an device used at around room temperature under a temperature difference of several tens degrees it has high function when its size and thickness ranges from several tens to several hundred $\mu$m. For example, such a content is described in, The "Transaction of the Institute of Electronics, Information and Communication Engineers C-II, Vol. J75-C-II, No. 8, pp. 416–424(JAPAN)" (in Japanese) and the like, while importance of design with respect to heat is set forth in the same paper.

Further, the number of couples of thermoelectric material chips in one thermoelectric device has been several hundreds at most and its density has been approximately several tens couples/cm². However, to increase the number of couples of thermoelectric material chips is one of very important factors in promoting its function and expanding its application. Especially, in power generation using a small temperature difference, generated electromotive force is in proportion to the number of couples of thermoelectric material chips and therefore, it is desirable to increase as many as possible the number of thermoelectric material chips connected in series in a thermoelectric device to generate a high voltage. Furthermore, also in case where a thermoelectric device is used as a cooling device or a temperature controlling device, electric current flowing in an device is enhanced when the number of thermoelectric material chips connected in series is small and it is necessary to enlarge wirings or to enlarge power sources. Accordingly, it is desirable to arrange as many thermoelectric material chips as possible in series.

As state above, miniaturizing, thinning, thermal design and an increase in the number of the couples of the thermoelectric material chips connected in series in a single thermoelectric device amount to high function of the thermoelectric device and at the same time are becoming points of expanding its application.

However, in making thermoelectric devices having the conventional structure shown in FIG. 16 by the manufacturing method shown in FIG. 17 and FIG. 18, it is necessary to handle the thermoelectric material chips one by one and there is a limitation for reducing the size of the chip and the size of the device considering the operational performance and the working accuracy. Especially, thermoelectric materials having good function including Bi-Te series materials, Fe-Si series material and the like are substances having low mechanical strength. Therefore, in making a thermoelectric device in which the size of the thermoelectric material chip is no more than several hundreds $\mu$m or the number of chips is extremely large, the handling of the thermoelectric material is difficult and it is difficult to make thermoelectric device having the conventional structure by the conventional manufacturing method.

Further, when a large number of thermoelectric elements are line-up in series with one another, if there is a discontinuity even at just one part of the electrodes or the thermoelectric materials, the function of the device is impaired. This problem lowers the manufacturing yield and at the same time is considered important from the point of view of cost.

It is an object of the present invention to provide a thermoelectric device which is small in scale and high in function and a method of making thereof by reducing the size of the thermoelectric material chips and increasing the number of thermoelectric material chips per unit area (chip density).

SUMMARY OF THE INVENTION

The present invention allows to adopt a new manufacturing method by improving the arrangement of thermoelectric material chips in the conventional thermoelectric device on substrates and provides a thermoelectric device in which the size of thermoelectric material chips is reduced and the chip density is enhanced.

Outline of the present invention is as follows.

The first object of the invention is to provide a thermoelectric device comprising two sheets of substrates each having electrodes and at least one of couples of P-type and N-type thermoelectric material chips interposed by the two sheets of substrates and PN-coupled via the electrodes, wherein a sectional shape of each of the thermoelectric material chips cut by a plane in parallel with the two sheets of substrates is quadrangular and the thermoelectric material chips and electrodes for PN junctions are arranged such that a positional and directional relationship between a straight line connecting centers of quadrangles of the electrically coupled P-type and N-type thermoelectric materials and each of four sides constituting the quadrangle that is the sectional shape of each thermoelectric material chip forming a couple of PN junction is not in an orthogonal or parallel relationship.

In other words, above mentioned "positional and directional relationship" means that a distance between the centers of quardrangles of the electrically conpled P-type and N-type thermoelectric material chips is ranged from a half to equal distance between the centers of quadrangles of the same type chips which are disposed mostly closed.

Another object of the invention is to provide a thermoelectric device comprising two sheets of substrates each having electrodes and at least one of couples of P-type and N-type thermoelectric material chips interposed by the two sheets of substrates and PN-coupled via the electrodes, wherein a sectional shape of each of the thermoelectric chips cut by a plane in parallel with the two sheets of substrates is quadrangular, at the same time the thermoelectric material chips are arranged in a lattice form on the substrates in side directions of a quadrangle that is the sectional shape of each of the thermoelectric material chips, the P-type thermoelectric material chips and the N-type thermoelectric material chips are alternately arranged at a first side constituting the lattice arrangement of the chips and rows of only the P-types thermoelectric material chips or only the N-type thermoelectric material chips are alternately arranged at a second side thereof.

According to the thermoelectric device described above, degree of freedom of design and manufacturing method of thermoelectric devices having a plurality of PN junctions can be broadened by the positional relationship between the P-type thermoelectric material chips and the N-type thermoelectric material chips as well as the directional relationship between the P-type and N-type thermoelectric material chips and electrodes for PN junctions, and therefore, a thermoelectric device comprising thermoelectric material chips of several hundred $\mu$m or less can be manufactured.

Another object of the invention is to provide the thermoelectric device according to above mentioned device, wherein dummy thermoelectric material chips which are not electrically connected are bonded and included in the device other than the thermoelectric material chips having PN junctions and constituting the device.

According to the thermoelectric device described above, the mechanical strength of the thermoelectric device can be enhanced by bonding the electrically isolated thermoelectric material chips to the substrates.

Another object of the invention is to provide a thermoelectric device as set forth above wherein the thermoelectric device has electrodes each of which is connected with a plurality of chips of a same type among the electrodes formed on the substrates for forming couples of PN junctions.

According to the thermoelectric device described above, the thermoelectric material chips having a same type are bonded to an electrode for PN junction and therefore its mechanical strength is enhanced and the device can achieve the function even if one of them is destroyed.

Another object of the invention is to provide a thermoelectric device comprising two sheets of substrates each having electrodes and at least one of couples of P-type and N-type thermoelectric material chips interposed by the two sheets of substrates and PN-coupled via the electrodes, wherein a sectional area or width of each of the thermoelectric material chips is changed in a width thereof in a direction orthogonal to the substrate.

According to the thermoelectric device described above, in case where the Peltier effect is utilized, it is possible to prescribe a location of generating Joule heat caused by flowing current depending on the sectional shape. Further, in making the thermoelectric device, a thermoelectric device comprising thermoelectric material chips of several hundreds $\mu$m or less can be manufactured and its yield can be promoted.

Another object of the invention is to provide a thermoelectric device comprising two sheets of substrates each having electrodes and at least one of couples of P-type and N-type thermoelectric material chips interposed by the two sheets of substrates and PN-coupled via the electrodes, wherein structures are provided proximate to portions of a surface of at least one of the substrates at which the thermoelectric material chips and the substrate are bonded.

According to the thermoelectric device described above, a bonding material such as solder is prevented from oozing in bonding the substrates to the thermoelectric materials and at the same time the positioning of the thermoelectric materials to the substrates is facilitated by the structures proximate to bonding portions of the substrates.

As another object of the invention, the sizes or shapes of the structures proximate to the bonding portions on a single substrate are different depending on the portions in which the P-type thermoelectric material chips or the N-type thermoelectric material chips are disposed and therefore, the bonding can be performed without taking wrong types of the thermoelectric materials. Further, when the thermoelectric device is manufactured by a step of performing PN junction by firstly bonding the P-type thermoelectric material chips and N-type thermoelectric material chips to the respectively separate substrates and thereafter by opposing the substrates, the positional-accuracy of bonding can be promoted by making smaller the structures used for positioning in the first bonding, allowance is provided to the positioning in the second bonding (PN bonding) and at the same time the bonding material can be prevented from oozing by making larger the structures used in the positioning therefor.

As another object of the invention, the sizes or shapes of the structures provided on the substrates are different with respect to a same thermoelectric material chip depending on the two sheets of substrates and therefore, the bonding can be performed without taking wrong types of thermoelectric materials. Further, in case where the thermoelectric device is manufactured by the step of performing PN junction by firstly bonding the P-type thermoelectric material chips or the N-type thermoelectric material chips to the respectively different substrate and thereafter opposing the substrates, the positional accuracy of bonding can be promoted by making smaller the structures used for positioning in the first bonding, allowance is provided to the positioning in the second bonding (PN bonding) and at the same time the bonding material can be prevented from oozing by making larger the structures used in the positioning therefor.

As another object of the invention, the structures proximate to the bonding portions on the substrates are made of a high polymer material having poor thermal conductivity and therefore, heat can be prevented from flowing from a high temperature end to a low temperature end of the thermoelectric device by which the function of the device is not lowered.

As another object of the invention, the structures proximate to the bonding portions on the substrates are made of a cured photosensitive resin by which a miniaturization can be achieved by photolithography and therefore, the structures are effectively operated in manufacturing a thermoelectric device comprising thermoelectric material chips of several hundreds $\mu$m or less.

Another object of the invention is to provide a thermoelectric device comprising two sheets of substrates each having electrodes and at least one of couples of P-type and N-type thermoelectric material chips interposed by the two sheets of substrates and PN-bonded via the electrodes, wherein at least one of the two sheets of substrates are made of silicon.

According to the thermoelectric device described above, a fine working can be performed by using silicon for the substrates and therefore, a thermoelectric device comprising thermoelectric material chips of several hundred $\mu$m or less can be manufactured. Further, the thermal conductivity of silicon is higher than that of ceramics such as alumina as well as higher than that of a metal such as aluminium at low temperatures, an effective absorption of heat from the substrates can be carried out and therefore, the function of the thermoelectric device can be promoted.

Another invention is to provide a thermoelectric device comprising two sheets of substrates each having electrodes and at least one of couples of P-type and N-type thermoelectric material chips interposed by the two sheets of substrates and PN-coupled via the electrodes, wherein compositions of bonding materials for bonding the thermoelectric material chips to electrodes formed on the two sheets of substrates in bonding thereof on at least one of the two sheets of substrates are respectively different depending on a difference in types of the thermoelectric material chips.

According to the thermoelectric device described above, in the bonding for forming the couples of PN junctions after bonding the P-type thermoelectric material chips and the N-type thermoelectric material chips to the respective separate substrates, the bonding can be facilitated.

Another invention is to provide a thermoelectric device comprising two sheets of substrates each having electrodes and at least one of couples of P-type and N-type thermoelectric material chips interposed by the two sheets of substrates and PN-coupled via the electrodes, wherein the thermoelectric material chips and first electrodes formed on the two sheets of substrates for forming PN junctions are bonded through protruded second electrodes.

According to the thermoelectric device described above, the PN junctions can easily be formed by the protruded second electrodes and therefore, a method of making a thermoelectric device comprising thermoelectric material chips having a size of several hundred $\mu$m can be adopted.

As another object of the invention, the protruded electrodes are provided with a solder bump structure formed on the thermoelectric materials and therefore, even if heights of the P-type thermoelectric material chips and the N-type thermoelectric material chips are made different, the difference in the heights can be canceled by the solder due to melting of solder in bonding and the thermoelectric element can easily be manufactured.

Another object of the invention is to provide electrodes connecting to the electrodes for PN junctions formed on the substrates sandwiching the thermoelectric material chips so as to connect the chips in series within the device. These electrodes not only junction the thermoelectric material chips but also establish connection with outside device or with other electrodes within the device.

By providing above mentioned electrodes, when there is a defect such as a discontinuity in the thermoelectric material chips within the device or the electrodes for PN junctions on the substrate at the time of device assembly or after module assembly, if the electrodes are electrically connected so as to avoid the electrically defective portion it is possible to allow the apparatus to function as a device although the performance of the entire apparatus is reduced by the function of the removed portion. Also, by using these electrodes as inspection electrodes, the existence and position of defects such as discontinuities within the module can be identified. The electrodes of the present invention can therefore be used as input/output electrodes.

Another invention is to provide a method of making a thermoelectric device comprising two sheets of substrates each having electrodes and at least one of couples of P-type and N-type thermoelectric material chips interposed by the two sheets of substrates and PN-coupled via the electrodes wherein P-type and N-type plate-like or rod-like thermoelectric materials (hereinafter, plate-like or rod-like thermoelectric materials are called wafer-like thermoelectric materials or thermoelectric material wafers) are bonded to each of the two separate sheets of substrates having predetermined electrodes to form PN junctions. Next, portions of each of the bonded thermoelectric material wafers are cut and eliminated in accordance with the necessity to show up electrodes to which thermoelectric material chips having respective different types are to be bonded. At this occasion, portions of the substrate or the electrodes are cut in accordance with the necessity. By these steps two sheets of the substrates are formed; in one of the substrates, the P-type thermoelectric material chips are bonded to the predetermined electrodes and the electrodes to which the N-type thermoelectric material chips are to be bonded, come into view on its surface, and in the other one of the substrates, the N-type thermoelectric material chips are bonded to the predetermined electrodes and the electrodes to which the P-type thermoelectric material chips are to be bonded, come into view on its surface. Next, with respect to the two sheets of the substrates, their faces bonded with the thermoelectric material chips are opposed, the respective thermoelectric material chips and the electrodes of the substrates are positioned to predetermined locations and the distal ends of the respective thermoelectric material chips and the electrodes for PN bonding on the substrates are bonded whereby couples of PN junctions interposing the electrodes of a metal or the like are formed and the thermoelectric device is finished.

According to the method of making a thermoelectric device described above, after separately bonding the P-type and N-type thermoelectric material wafer respectively and separately to the two sheets of substrates each of which is previously provided with predetermined electrode wirings for forming the PN junctions, predetermined portions of the bonded thermoelectric material wafers are cut and eliminated thereby forming thermoelectric material chips bonded to the substrates. At this instance, the electrodes to be bonded to the thermoelectric material chips of different types show up. The substrate in a state in which the P-type thermoelectric material chips are bonded thereto and the substrate in a state in which the N-type thermoelectric material chips are bonded thereto both formed thereby are opposed and bonded together at predetermined locations by which the thermoelectric device can be manufactured.

BRIEF DESCRIPTION OF THE DRAWINGS

FIGS. 4A–E illustrate views showing outline of steps of manufacturing the thermoelectric device according to the EMBODIMENT-1 of the present invention.

FIGS. 6A–F illustrate views showing outline of steps of manufacturing a thermoelectric device according to EMBODIMENT-2 of the present invention.

FIGS. 14A–E illustrate views showing outline of steps of manufacturing a thermoelectric device according to EMBODIMENT-6 of the present invention.

DETAILED DESCRIPTION OF THE PREFERRED EMBODIMENTS

A detailed explanation will be given of the present invention based on embodiments in reference to the drawings.

EMBODIMENT-1

Figure 1:
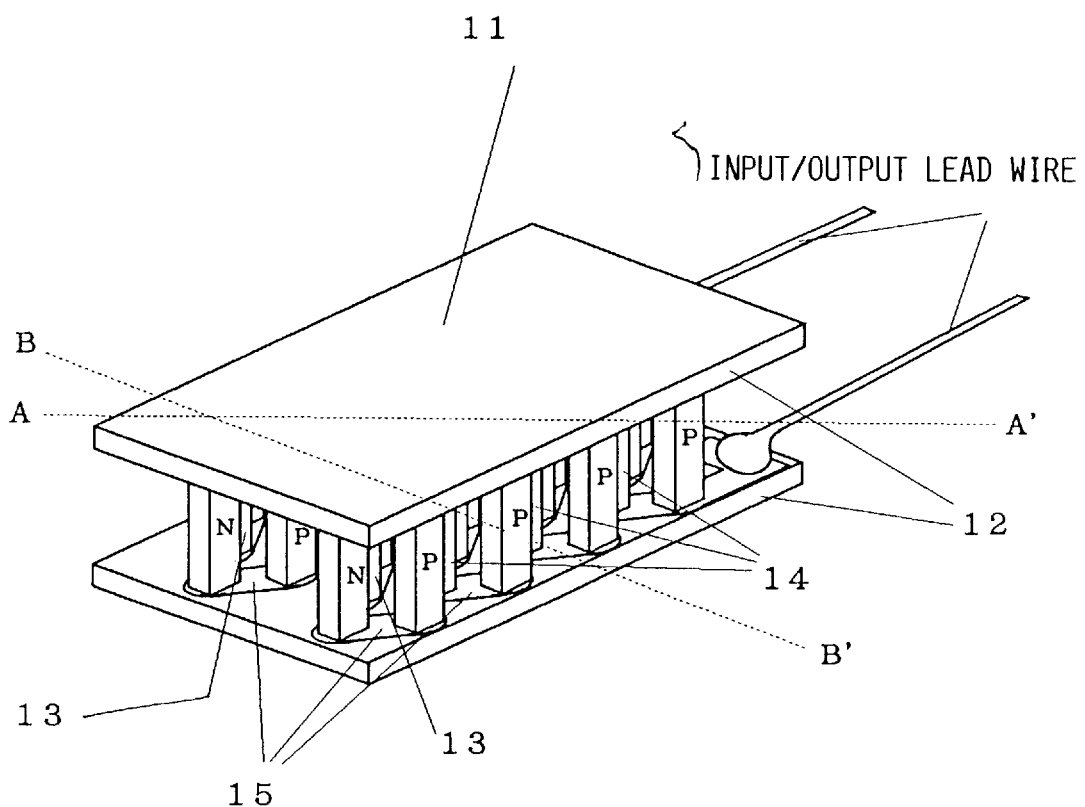
FIG. 1 is a view showing outlook of a thermoelectric device according to the present invention.
Figure 2A:
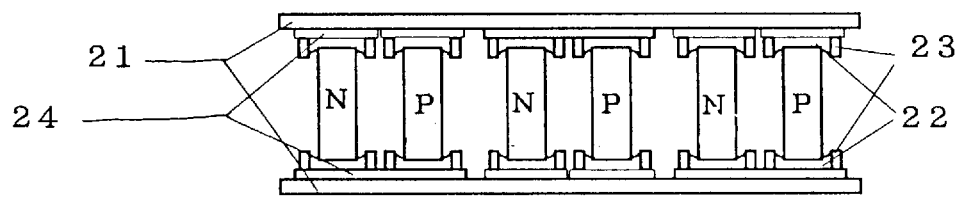
FIGS. 2A–B illustrate views showing sections of major portions taken along lines A—A' and B—B' of FIG. 1.
Figure 2B:
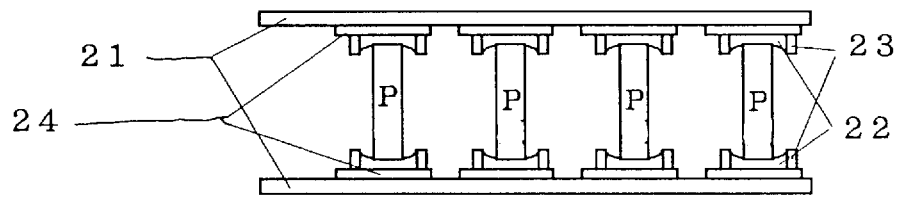

FIG. 1 is a view showing appearance of a thermoelectric device according to the present invention. The basic structure of a thermoelectric device 11 shown in FIG. 1 comprises substrates 12, P-type thermoelectric material chips 13, N-type thermoelectric material chips 14 and electrodes 15 for PN junction. FIG. 2A and FIG. 2B are views showing sections of major portions taken along lines A—A' and B—B' of FIG. 1 showing appearance of the thermoelectric device, respectively.

Figure 3:
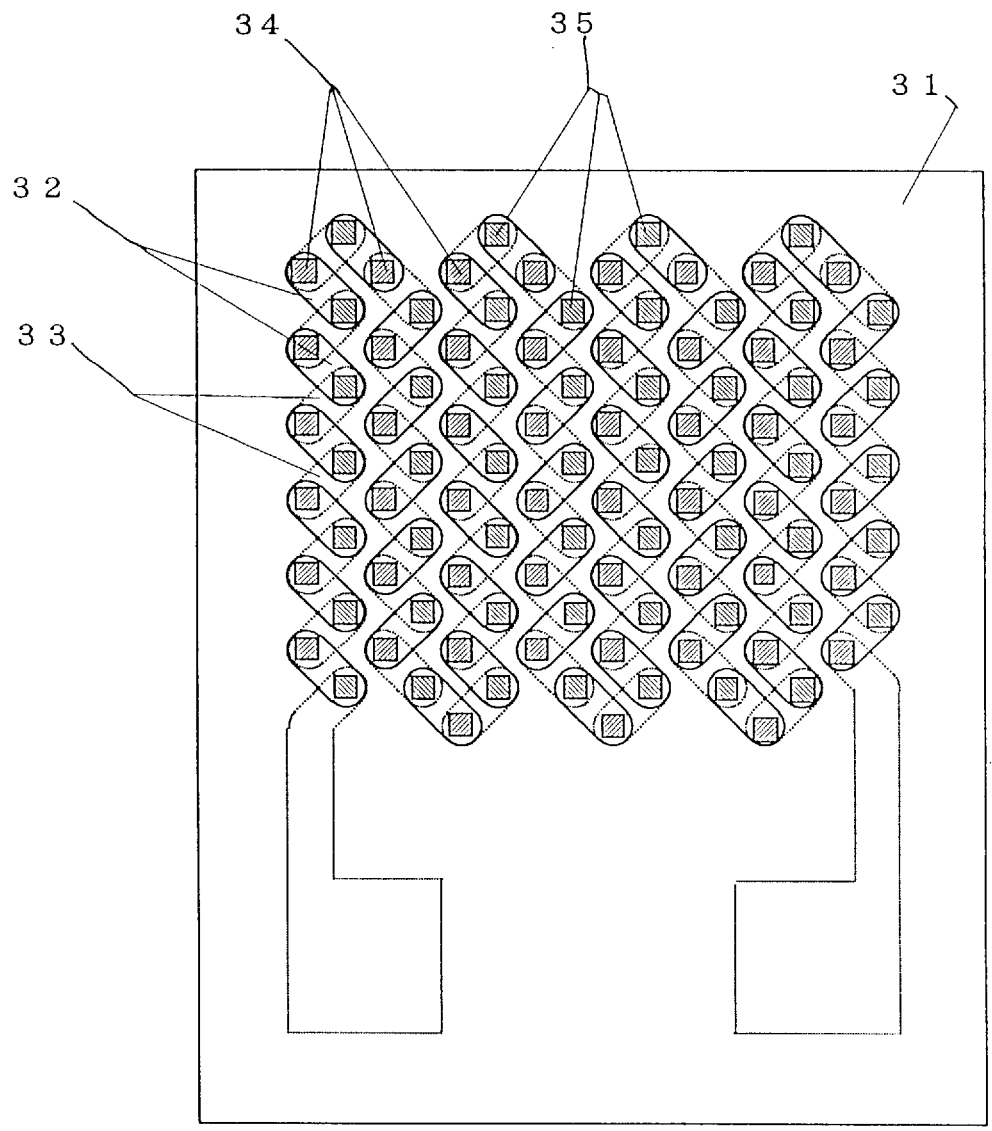
FIG. 3 is view showing a relationship between arrangement of thermoelectric material chips and electrodes of a thermoelectric device shown in EMBODIMENT-1 of the present invention.
Figure 4A:
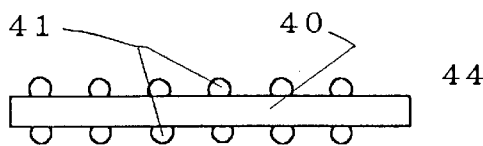
Figure 4B:
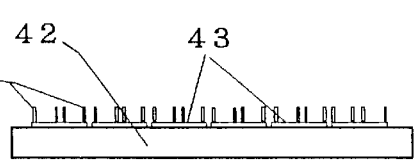
Figure 4B:
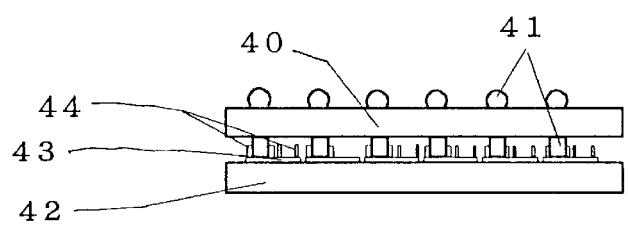
Figure 4B:
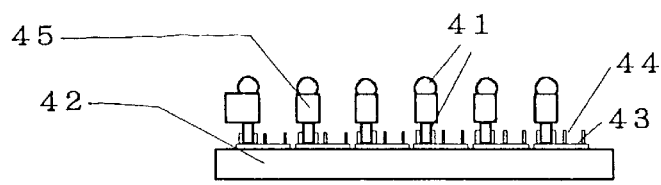
Figure 4B:
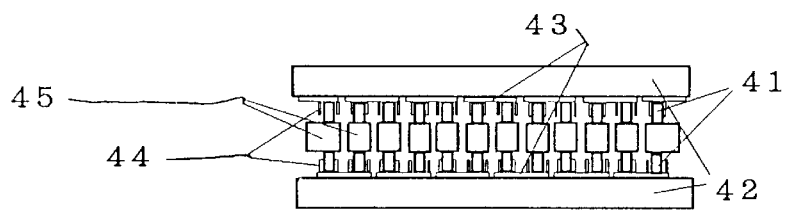

In the sectional views of FIG. 2, in addition to the major portions of the thermoelectric device, structures 23 of the present invention are formed on the substrates 21 at the surroundings of bonding portions. In FIG. 2A that is a sectional view taken along the line A—A' of FIG. 1, the P-type thermoelectric material chips and the N-type thermoelectric material chips are arranged alternately whereas in FIG. 2B that is a sectional view taken along the line B—B' of FIG. 1, only P-type thermoelectric material chips or N-type thermoelectric material chips are arranged. FIG. 3 is a perspective view showing an electrode pattern and a positional relationship among the thermoelectric material chips viewing the thermoelectric device of FIG. 1 from above. (Appearance and concept are shown in FIG. 1, FIG. 2 and FIG. 3 and dimensions, a number of the thermoelectric material chips and the like are determined in accordance with the purpose). In FIG. 3, among lines showing electrodes, bold lines show electrode patterns 32 of a top substrate and dotted lines show electrode patterns 33 of a bottom substrate. Incidentally, the expression of top substrate or bottom substrate is for convenience of explanation and naturally, any substrate can be a top or bottom one in the thermoelectric device. Further, quadrangles having two kinds of hatched lines respectively show a P-type thermoelectric material chip 34 and a N-type thermoelectric material chip 35.

An explanation will be given of a thermoelectric device and a method of making thereof according to the present invention having such a structure with respect to a small-scaled thermoelectric device in which the size of the thermoelectric material chip is 100 $\mu$m.

As thermoelectric material, a sintered body of Bi-Te series material that is excellent in properties around room temperature was used. As main characteristics of the thermoelectric material, in P-type, the Seebeck coefficient was 205 $\mu$V/deg, the specific resistivity was 0.95 m$\Omega$ cm and the heat conductivity was 1.5 W/m·deg whereas in N-type, the Seebeck coefficient was 170 $\mu$V/deg, the specific resistivity was 0.75 m$\Omega$ cm and the heat conductivity was 1.5 W/m·deg. As material for the substrate, a silicon wafer having the thickness of 300 $\mu$m that was electrically insulated by thermally oxidizing the surface was used. With respect to the size of the element and the like, the height of the thermoelectric material chip was 500 $\mu$m, the shape of a section of the thermoelectric material chip in parallel with the substrate was a square having a length of a side of 100 $\mu$m as mentioned above, a distance between nearest thermoelectric material chips of a same type in FIG. 3 was 200 $\mu$m (300 $\mu$m in center distance), a distance between nearest thermoelectric material chips of different types was 70 $\mu$m (300/$\sqrt{2}$=about 210 $\mu$m in center distance) and a number of element couples arranged in a single device in series was 125.

FIG. 4 illustrates views showing outline of steps for making the thermoelectric device of this embodiment. As shown in FIG. 4, the method of making is grossly classified into five steps. An explanation will be given thereof in due order.

In a bump forming step (A), a photoresist having the thickness of 50 $\mu$m was coated on both faces of respective thermoelectric material wafers 40 of P-type and N-type having the thickness of 500 $\mu$m and made of Bi-Te series sintered bodies. A resist layer having circular openings each having the diameter of opening of 90 $\mu$m, the arrangement of which was in a desired pattern, was formed by exposing and developing the photoresist. The desired pattern was determined based on the above dimensions to be conformed to the arrangement of the thermoelectric material chips specified in FIG. 3. Next, after cleaning by an acid or the like, a nickel plating of 40 $\mu$m was performed on the openings by an electric plating method to form so-called nickel bumps. Next, a solder plating was performed on the nickel layer similarly by an electric plating method to form a solder layer of 30 $\mu$m. The solder plating was performed to form a solder of tin and lead having a composition ratio of 6:4. Next, after removing the photoresist, a rosin group flux was coated on the solder-plated layer, and a reflow treatment was performed at 230° C. by which spherical solder bumps 41 having the diameter of approximately 100 $\mu$m could have been formed on the both faces of the thermoelectric material wafer 40.

In an electrode forming step (B), films of chromium, nickel and gold in this order from the substrate respectively having the thicknesses of 0.1 $\mu$m, 3 $\mu$m and 1 $\mu$m were formed by a sputtering method on the surface of a silicon wafer substrate 42 having the thickness of 300 $\mu$m on which an oxide layer of 0.5 $\mu$m was formed by thermal oxidation. Next, electrodes 43 were formed on the top and bottom substrates by photolithography conforming to the electrodes pattern of FIG. 3. Further, two kinds of doughnut-shaped structures 44 of a polyamide group photoresist were formed by photolithography at the surroundings of portions thereof to which the P-type thermoelectric material and the N-type thermoelectric material were bonded through the solder bumps. With respect to the size of the structure 44 comprising the polyamide group photoresist, in the two sheets of substrates constituting the thermoelectric device, the inner diameter of the doughnut shape was 120 $\mu$m the outer diameter was 150 $\mu$m the height was 30 $\mu$m at a position where the P-type thermoelectric material chip was disposed and the inner diameter was 140 $\mu$m, the outer diameter was 170 $\mu$m and the height was 30 $\mu$m at a position where the N-type thermoelectric material chip was disposed in one substrate, whereas in the other substrate, the inner diameter was 140 $\mu$m, the outer diameter was 170 $\mu$m and the height was 30 $\mu$m at a position where the P-type thermoelectric material chip was disposed and the inner diameter was 120 $\mu$m, the outer diameter was 150 $\mu$m and the height was 30 $\mu$m at a position where the N-type thermoelectric material chip was disposed.

In a bonding step (C), the thermoelectric material wafer 40 having the bumps 41 formed in the bump forming step (A) was opposed to the substrate 42 having the electrodes 43 and the doughnut-shaped structures 44 in the vicinity of the bonding portions formed by the electrodes forming step (B), predetermined positioning was performed and the thermoelectric material wafer 40 and the substrate 42 were bonded by melting the solder. Further, in the bonding of the P-type thermoelectric material wafer to the substrate, the solder bumps formed on the surface of the P-type thermoelectric material wafer were inserted into the inside of the smaller doughnut-type structures having the inner diameter of 120 $\mu$m, the outer diameter of 150 $\mu$m and the height of 30 $\mu$m which had been formed on the substrate thereby positioning the thermoelectric material wafer 40 to the substrate 42. Similarly, in bonding the N-type thermoelectric material wafer to the substrate, the solder bumps formed on the surface of the N-type thermoelectric material wafer were inserted into the smaller doughnut-shaped structures having the inner diameter of 120 $\mu$m, the outer diameter of 150 $\mu$m and the height of 30 $\mu$m which had been formed on the substrate thereby positioning the thermoelectric material wafer 40 to the substrate 42. In this procedure, smaller ones of the doughnut-shaped structures having two kinds of sizes which had been formed on the substrate in bonding the thermoelectric material wafer 40 to the substrate 42 to dispense with incorrect bonding positions and to promote mutual positioning accuracy.

In a cutting and eliminating step (D), portions of the thermoelectric material wafer 40 bonded to the substrate 42 were formed into thermoelectric material chips 45 bonded to the substrate 42 by cutting and eliminating other portions of the thermoelectric material wafer. At this instance, portions of the substrate 42 or the electrodes 43 might simultaneously be cut and eliminated in accordance with the necessity. In this embodiment, the cutting and eliminating step (D) was performed by using a dicing saw that was used in cutting silicon semiconductors and the like. A blade having a thickness of 200 μm was used in the cutting and eliminating step. The thickness of the blade was selected under conditions wherein the length of the side of the thermoelectric material chip 45 in this embodiment was 100 μm, the center distance between the nearest thermoelectric material chips of a same type was 300 μm and the thermoelectric material chips of different types were bonded in the positional relationship prescribed in FIG. 3. The cutting and eliminating of unnecessary portions of the thermoelectric material was performed at central portions between the solder bumps 41 and at the same time the height of the blade was adjusted so as not to destruct the electrodes 43 on the substrate by utilizing a gap between the thermoelectric material wafer 40 and the substrate 42 comprising nickel bumps having the height of 40 μm. With respect to the thermoelectric material of each type, the substrate 42 bonded substantially with 125 pieces of the thermoelectric material chip 45 was manufactured by longitudinally and transversely cutting and eliminating other portions by the blade of the dicing saw.

With regard to the substrate 42 bonded substantially with 125 pieces of the thermoelectric material chips 45, the 125 pieces thereof were substantially related to PN junctions in view of their arrangement when the rectangular thermoelectric material wafer was used under the arrangement and the constitution of the thermoelectric material chips prescribed in FIG. 3 and when the solder bumps were formed in 11 rows in the longitudinal direction by 12 rows in the transverse direction (132 pieces in total). In this case, with regard to unnecessary chips at outer peripheral portions, if any means of bonding was not provided, they were eliminated in the cutting and eliminating step resulting in no problem. However, they might be preserved by bonding them to the substrate by any means since mechanical enforcement and electric reliability of the formed thermoelectric device could be promoted by preserving the unnecessary chips by bonding them to the substrate. In this case, when enhancing of strength of the formed thermoelectric device was aimed, the thermoelectric device could be manufactured with no hindrance in steps if bonding pads for electrically isolated dummy chips were previously formed on the substrate in forming the electrodes and bonded thereto as in the other bumps. Further, by bonding bumps of the unnecessary chips to the substrate in which pads wired to shortcircuit near electrodes were previously formed, it was possible to preserve the chips and to achieve the mechanical reinforcement and the promotion of electric bonding reliability of the thermoelectric material chips at the outermost peripheral portions.

In an integrating step (E), two sheet of the substrates 42 respectively bonded with the thermoelectric material chips 45 of different types are opposed, the solder bumps formed on the distal ends of the respective chips and the electrodes 43 formed on the substrate were positioned to locations for bonding, the assembly was pressed and heated to melt the solder whereby the thermoelectric material chips 45 and the electrodes 43 on the substrate 46 were bonded thereby finishing the thermoelectric device having the PN junctions on the top and the bottom substrates. Further, positioning in bonding was performed by inserting the solder bumps 41 formed on the distal ends of the thermoelectric material chip 45 of respective types into the inside of the doughnut-shaped structures of the remaining larger ones (internal diameter; 140 μm, outer diameter; 170 μm, height; 30 μm) among the structures 44 formed on the substrate of different types to be bonded. Larger ones of the doughnut-shaped structures were selected in the positioning to facilitate the positioning of the thermoelectric material chips and the electrodes of the substrate and to prevent the solder from oozing in this embodiment, whereby their effect as well as that of the smaller doughnut-shaped structures in the bonding step (C) were sufficiently provided.

With respect to the final outer dimensions of the thermoelectric device formed as above, the thickness was approximately 1.2 mm (as for the components of the thickness, the thickness of the thermoelectric material chip was 0.5 mm, the thickness of the top and the bottom substrates respectively was 0.3 mm, the heights of the bonding material and the nickel bump in sum at the top and the bottom bonding portion were respectively 0.05 mm), the size was 4 mm×4 mm in the size of the lower substrate provided with input and output electrodes and electrically the internal resistance was 120 Ω. The size of the thermoelectric device of this embodiment having the thermoelectric material chips and the positional and arranging relationships of the electrodes for PN bonding as shown by FIG. 3 and manufactured by the method of making thereof, could not be achieved by the conventional manufacturing method in which the thermoelectric device was formed by forming the thermoelectric material chips and inserting them between the top and the bottom substrates.

When lead wires were connected to input and output electrodes of the thermoelectric device and respective characteristics were investigated, the following results was provided.

With respect to the power generation function based on the Seebeck effect, the open voltage between the substrates in a temperature difference of 2° C. was 90 mV and an output of 80 mV –70 μA was obtained by attaching a load resistor of 1 KΩ to the outside when a temperature difference of 2° C. was provided between the substrates. Further, when 16 pieces of the thermoelectric devices having 125 couples of PN junctions were connected in series and was carried by enclosing them in a quartz oscillator type electronic wrist watch, the watch could be driven at room temperature of 20° C.

With respect to the function of a cooling and heat generating element based on the Peltier effect, when an aluminium radiating plate was adhered to the substrate on the heat generating side by a silicone adhering agent having high thermal conductivity and a voltage of 6 V was applied between input electrodes, electric current of approximately 50 mA flowed and a phenomenon was caused on the surface of the substrate on the heat absorbing side in which moisture in the air was instantaneously frozen by which it was proven that the function of the thermoelectric device as a Peltier device was very excellent.

EMBODIMENT-2

Figure 5:
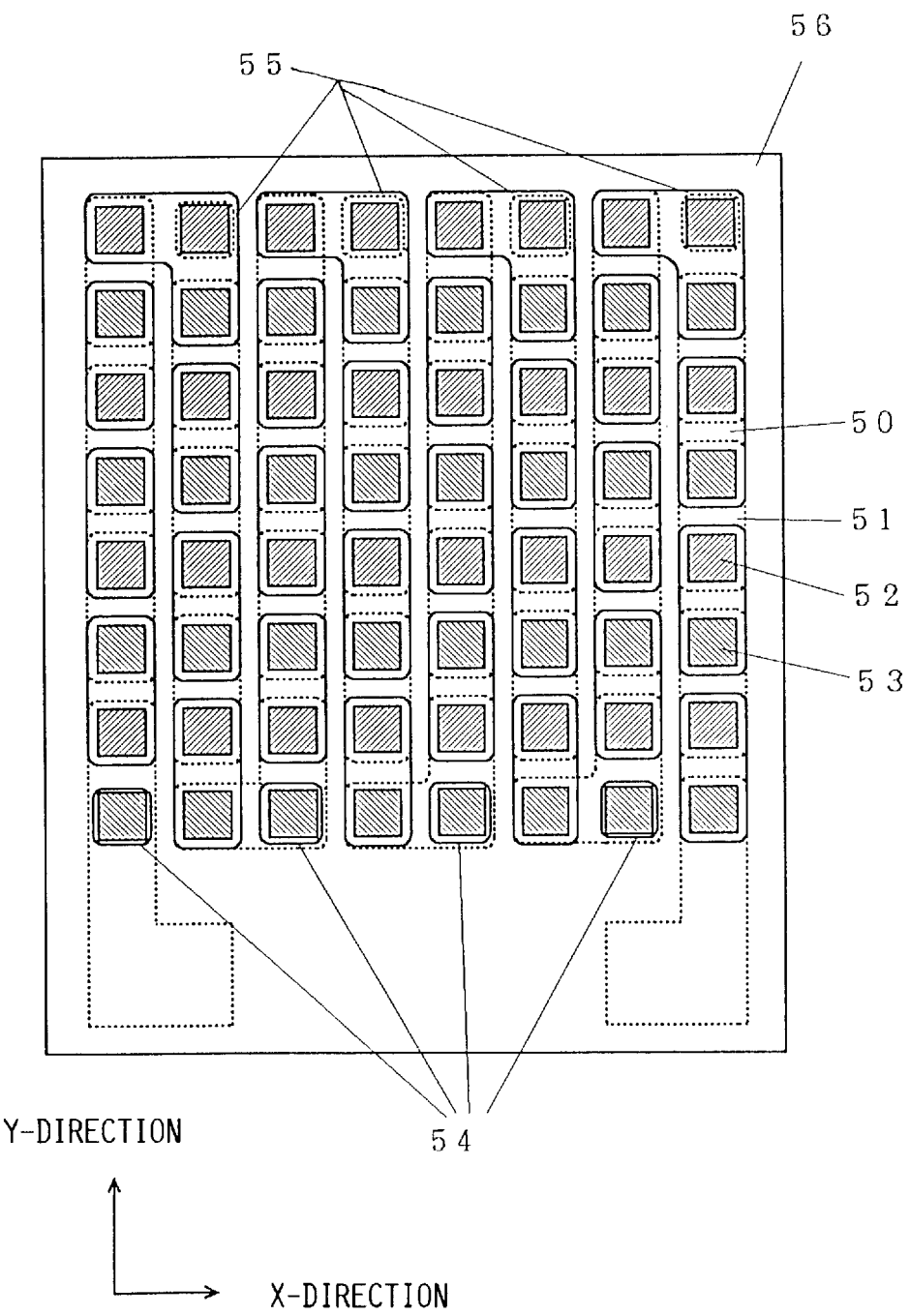
FIG. 5 is a view showing a relationship between arrangement of thermoelectric material chips and electrodes of a thermoelectric device according to EMBODIMENT-2 of the present invention.
Figure 7A:
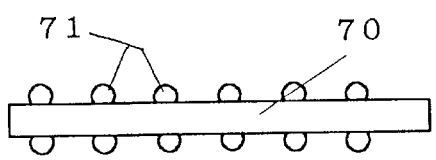
FIGS. 7A–E illustrate views showing outline of steps of manufacturing a thermoelectric device according to EMBODIMENT-3 of the present invention.
Figure 7B:
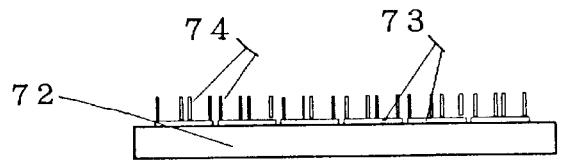
Figure 7C:
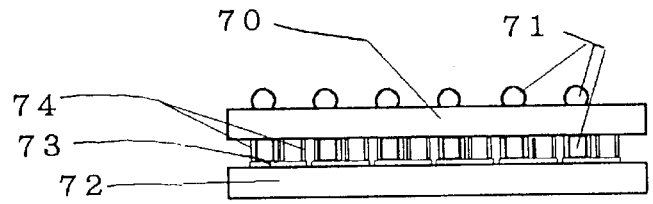
Figure 7D:
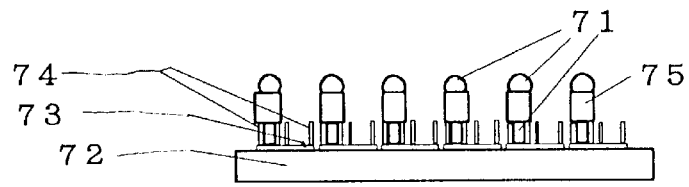
Figure 7E:
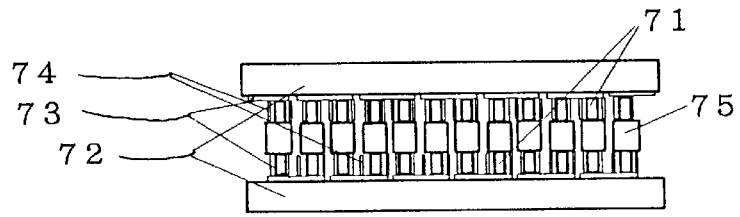
Figure 8A:
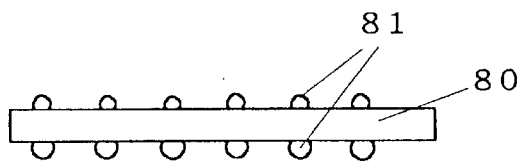
FIGS. 8A–F illustrate views showing outline of steps of manufacturing a thermoelectric device according to EMBODIMENT-4 of the present invention.
Figure 8B:
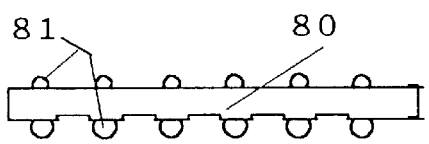
Figure 8C:
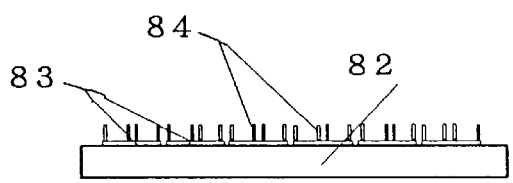
Figure 8D:
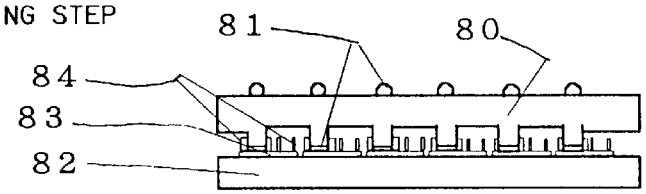
Figure 8E:
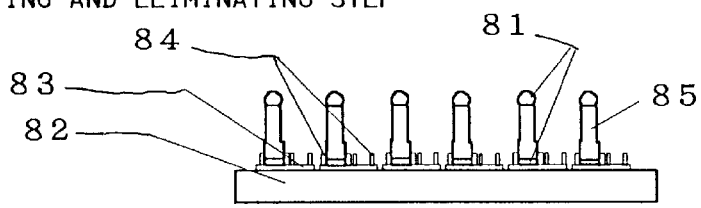
Figure 8F:
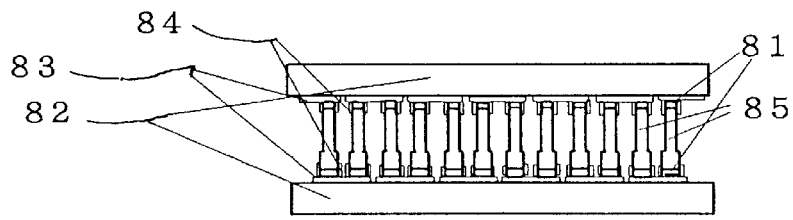

FIG. 5 is a perspective view viewing from a top substrate for explaining outline of electrodes and thermoelectric material chips on a substrate of a thermoelectric device in accordance with EMBODIMENT-2. In FIG. 5, among lines showing electrodes, bold lines indicate an electrode pattern 50 of a top substrate and dotted lines indicate electrode pattern 51 of a bottom substrate. Incidentally, the expression of top substrate or bottom substrate is for convenience of explanation and naturally, any substrate may be a top or bottom one in the thermoelectric device. Further, quadrangles provided with two kinds of hatched lines respectively indicate a P-type thermoelectric material chip 52 and a N-type thermoelectric material chip 53. Further, thermoelectric material chips provided at the outer peripheral portions of the thermoelectric device that are not related to PN junctions (hereafter called dummy chips), are bonded and fixed to the top substrate and the bottom substrate by dummy electrodes 54 of the top substrate and dummy electrodes 55 of the bottom substrate. In FIG. 5, the dummy chip is connected to the dummy electrode on one substrate and connected to the electrode performing PN junction on the other substrate, however, there may be dummy electrodes connected to both of the substrates. In either case, the dummy chips perform mechanical reinforcement of the thermoelectric device comprising small-scaled thermoelectric material chips manufactured in this embodiment. As shown in FIG. 5, with regard to the arrangement of the thermoelectric material chips in the thermoelectric device of this embodiment, in viewing a certain row in the X direction, only P-type thermoelectric material chips or only N-type thermoelectric material chips are arranged and the rows of the P-type thermoelectric material chips and the rows of the N-type thermoelectric material chips are alternately arranged. Meanwhile, in the Y direction, in viewing a certain row, the P-type thermoelectric material chips and the N-type thermoelectric material chips are alternately arranged.

In this embodiment, a thermoelectric device was manufactured having such a structure and the arrangement of the thermoelectric material chips in which the size of the thermoelectric material chip in a section in parallel with the substrates was 500 $\mu$m, the height was 500 $\mu$m, the center distance between nearest thermoelectric material chips was 1,000 $\mu$m and the number of the thermoelectric material chips (including dummy chips) was 64 pieces in sum of the P-type and N-type ones.

As the thermoelectric material, a sintered body of Bi-Te series material which was the same as that in EMBODIMENT-1 and of which function was excellent at around room temperature, was used. As major characteristics of the thermoelectric material, in P-type, the Seebeck coefficient was 205 $\mu$V/deg, the specific resistivity was 0.95 m$\Omega$ cm, the heat conductivity was 1.5 W/m·deg, and in N-type, the Seebeck coefficient was 170 $\mu$V/deg, the specific resistivity was 0.75 m$\Omega$ cm and the heat conductivity was 1.5 W/m·deg. Alumina having the heat conductivity of 20 W/m·deg was used as substrate material.

FIG. 6 is a view showing outline of steps for manufacturing the thermoelectric device. An explanation will be given to respective steps in reference to FIG. 6 as follows.

In a bonding layer forming step (A), a nickel plating was performed on both faces to be bonded to the substrate among surfaces of a thermoelectric material wafer 60 having the thickness of 500 $\mu$m by a wet plating method by which a nickel layer 61 having the thickness of 10 $\mu$m was formed. One of the faces on which the nickel layers were formed was masked, solder plating having the solder composition of tin:lead=1:9 was performed on the other face by a wet plating method by which a solder layer 62 having the thickness of 30 $\mu$m was formed. Next, the plating mask was stripped, the solder layer 62 having the solder composition of tin:lead=1:9 was masked and a solder plating having the solder composition of tin:lead=6:4 was performed on another nickel layer 61 by a wet plating method by which a solder layer 63 having the thickness of 30 $\mu$m was formed, and by stripping the plating mask a thermoelectric material wafer having the solder layer 62 with the solder composition of tin:lead=1:9 on one face and the solder layer 63 with the solder composition of tin:lead=6:4 on the other face, was formed. Next, a rosin group flux was coated on the solder layer 62 and 63 on the both faces and the solder was reflowed at 350° C. by which the solder layers were made uniform and the surfaces thereof were cleaned. Incidentally, in regard of steps, the reflow treatment may be performed after a grooving step that is successive to the bonding layer forming step.

In a grooving step (B), a dicing saw was used by which grooving was performed longitudinally and transversely on the side of the solder layer 62 having the solder composition of tin:lead=1:9 up to the depth of 90 $\mu$m from the surface of the solder layer 62 by a blade having the blade width of 1.5 mm. The feed of the blade between grooves was determined to be 2 mm such that an interval of a protrusion formed between the grooves became 0. 5 mm that was the size of the thermoelectric material chip. The depth of grooving was determined to be 90 $\mu$m from the surface of the solder layer such that contiguous protrusions were not shortcircuited in a later bonding step and the grooves produced a gap between the thermoelectric material wafer and the substrate that was necessary in a later step of chip formation by cutting and eliminating.

In an electrode forming step (C), a copper plate having the thickness of 0.1 mm on an alumina substrate 64 having the thickness of 0.5 mm having the thickness of 0.1 mm was worked into electrodes 65 by photoetching constituting the top substrate or the bottom substrate pattern as shown in FIG. 5.

In a bonding step (D), protrusions 68 of the thermoelectric wafer 60 and the electrodes 65 were positioned and the solder layer 62 having the composition of tin:lead=1:9 of the protrusions was molten by which the electrodes 60 and the thermoelectric wafer were bonded. The bonding temperature at this instance was 340° C.

In a cutting and eliminating step (E), cutting and eliminating were performed by using a dicing saw with a blade having the blade width of 1.5 mm with respect to cutting in the X direction specified in FIG. 5 and with a blade having the blade width of 0.5 mm with respect to cutting in the Y direction without destructing the electrodes 65 on the substrate 64 in which blade edges were disposed at grooves (recess) 67 formed in the grooving step thereby forming the thermoelectric material chips 66.

In an integrating step (F), two sheets of the substrates 64 respectively bonded with the thermoelectric material chips 66 of different types are opposed, the solder layer 63 having the solder composition of tin:lead=6:4 formed on the distal ends of the respective chips and the electrodes 65 formed on the substrate 64 were positioned at locations at which the both were to be bonded, the assembly was heated while being pressed to melt the solder whereby the thermoelectric material chips 66 were bonded to the electrodes 65 on the substrate 64 by which the thermoelectric device having the PN junctions on the top and the bottom substrates could have been finished. Further, the temperature in bonding was determined to be 230° C. at which the solder having the composition of tin:lead=1:9 for the previous bonding was not molten. Accordingly, the integrating step could be performed without toppling or shifting the thermoelectric material chips even if structures were not provided around the bonding portions.

The thermoelectric device of this embodiment was made by the manufacturing method essentially similar to that in making the thermoelectric device described in EMBODIMENT-1. Although the locations and arrangement of the thermoelectric material chips and the arrangement of the electrodes for PN bonding in EMBODIMENT-1 are preferable when the thermoelectric material chips are extremely small, the locations and arrangement of the thermoelectric material chips and the arrangement of the electrodes for PN boding of this embodiment are preferable to enhance the density of the thermoelectric material chips in the thermoelectric device. Further, the thermoelectric device and the method of making thereof according to this embodiment are preferable to restrict the amount of the thermoelectric material to be removed in the cutting and eliminating step.

With regard to the final outer dimensions of the thermoelectric device formed as above, the thickness was approximately 1.5 mm and the size was 9 mm×8 mm in the size of the bottom substrate provided with input and output electrodes and electrically the internal resistance was 1 Ω. Its function as a cooling and heat generating element based on the Peltier effect was investigated by connecting lead wires to input electrodes of the thermoelectric device. When an aluminum radiating plate was adhered to the substrate on the heat generating side by a silicone adhesive agent having high conductivity and when voltage of 1 V was applied between the input electrodes, current of approximately 1 A flowed and a rapid cooling was caused on the side of the heat absorbing substrate. A ratio of input power to an amount of heat absorbing, so called COP (coefficient of performance) was 0.55 at a temperature difference of 20° C. which proved that this thermoelectric device has excellent function.

EMBODIMENT-3

An explanation will be given of making a small-scaled thermoelectric device in which the size of thermoelectric material chips is 50 $\mu$m with respect to a thermoelectric device having an electrode pattern similar to that in EMBODIMENT-1.

As the thermoelectric material, a sintered body of Bi-Te series material was used which was the same as that in EMBODIMENT-1 and was excellent in its function around room temperature. With regard to major characteristics of the thermoelectric material, in P-type, the Seebeck coefficient was 205 $\mu$V/deg, the specific resistivity was 0.95 mΩ cm and the heat conductivity was 1.5 W/m·deg and in N-type, the Seebeck coefficient was 170 $\mu$V/deg, the specific resistivity was 0.75 mΩ cm, and the heat conductivity was 1.5 W/m·deg. As substrate material, a silicon wafer having the thickness of 300 $\mu$m which was electrically insulated by thermally oxidizing the surface was used. With regard to the size of the device and the like, the height of the thermoelectric chip was 500 $\mu$m, the shape of a thermoelectric material chip at a section in parallel with the substrate was a square, the length of which side was 50 $\mu$m as above, the center distance between nearest thermoelectric material chips of a same kind in FIG. 3 was 100 $\mu$m (150 $\mu$m in center distance), the distance between nearest thermoelectric material chips of different types was 35 $\mu$m (150/$\sqrt{2}$=about 110 $\mu$m in center distance) and a number of element couples arranged in series in a single element was 51.

FIG. 7 is a view showing outline of steps for manufacturing the thermoelectric device of this embodiment. As shown in FIG. 7, the manufacturing method is grossly classified into five steps. An explanation will be given thereto in due order.

In a bump forming step (A), a photoresist having the thickness of 20 $\mu$m was coated on the both faces of thermoelectric material wafers 70 respectively of P-type and N-type having the thickness of 500 $\mu$m each of which was made of a Bi-Te series sintered body. A pattern of the resist was formed by exposing and developing the photoresist such that circular openings each having the diameter of opening of 45 $\mu$m were formed and their arrangement was in a desired pattern. The desired pattern was determined based on the above-mentioned dimensions such that the pattern conformed to the arrangement of the thermoelectric material chips in FIG. 3. A nickel plating of 20 $\mu$m was firstly performed on the openings to form so-called nickel bumps by an electric plating method after cleaning them by an acid or the like. Next, a solder plating was performed on the nickel layer similarly by an electric plating method to form a solder layer of 30 $\mu$m. Here, the solder plating was performed such that the ratio of tin:lead became 6:4. Next, when a rosin group flux was coated on the solder-plated layer after stripping the photoresist and a reflow treatment was performed thereon at 230° C., spherical solder bumps 71 having the diameter of approximately 50 $\mu$m could be formed on the both faces of the thermoelectric material wafer 70.

In an electrode forming step (B), films of chromium, nickel and gold respectively having the thicknesses of 0.1 $\mu$m, 2 $\mu$m and 1 $\mu$m in this order from the side of the substrate were formed by a sputtering method on the surface of a silicon wafer substrate 72 having the thickness of 300 $\mu$m of which surface is provided with an oxide layer of 0.5 $\mu$m by thermal oxidation. Next, electrodes 73 were formed on the top and bottom substrates by photolithography such that they conformed to the electrode patterns of FIG. 3. Further, two kinds of structures 74 each having a bonding portion in a hollow cylindrical form around a portion of the electrode to be bonded to the P-type thermoelectric material or the N-type thermoelectric material through the solder bumps were formed by photolithography using a thick film photoresist. With regard to the shape and the size of the structures 74 constituted by the thick film photoresist, in one substrate among two sheets of substrates constituting the thermoelectric device, the diameter of the cylinder at a location where the P-type thermoelectric material chip was disposed was 60 $\mu$m, the diameter thereof at a location where the N-type thermoelectric material chip was disposed was 70 $\mu$m and the other portions of the substrate was covered with the resist having the thickness of 40 $\mu$m. In the other substrate, the diameter at a location where the P-type thermoelectric material chips was disposed was 70 $\mu$m, the diameter at a location where the N-type thermoelectric material chip was disposed was 60 $\mu$m and the other portion of the substrate was covered with the resist having the thickness of 40 $\mu$m. Here, the thickness of the resist was determined to be 40 $\mu$m to use the structures formed thereby to produce a gap in a successive step (C) of bonding the thermoelectric material wafer 70 to the substrate 72 and a step (D) successive to step (C) of cutting and eliminating the thermoelectric material wafer 70. In EMBODIMENT-1, the gap was produced by the nickel bumps. In EMBODIMENT-4, the gap between the thermoelectric material wafer 70 and the substrate 72 necessary in the cutting and eliminating step (D) was 30 $\mu$m or more. By contrast, in forming the bumps 71 on the thermoelectric material wafer 70 in the preceding step, it was difficult to render the height of the nickel bumps producing the gap to be 20 $\mu$m or more due to a limitation of photolithography technology and plating technology.

In a bonding step (C), after performing a predetermined positioning between the thermoelectric material wafer 70 attached with the solder bumps 71 formed in the bump forming step (A) and the substrate 72 on which the electrodes 73 and the structures 74 in the vicinities of the bonding portions both were formed in the electrode forming step (B), the solder was molten and the thermoelectric material wafer 70 was bonded to the substrate 72. Further, in bonding the P-type thermoelectric material wafer to the substrate, the positioning between the thermoelectric material wafer 70 and the substrate 72 was performed by inserting the solder bumps formed on the surface of the P-type thermoelectric material wafer into the inside of openings for bonding of the structures 74 having the diameter of 60 μm that were formed on the substrate. Similarly, in bonding the N-type thermoelectric material wafer to the substrate, the positioning between the thermoelectric material wafer 70 and the substrate 73 was performed by inserting the solder bumps formed on the surface of the N-type thermoelectric material wafer into the inside of openings for bonding of the structure 74 having the diameter of 60 μm that were formed on the substrate. The smaller ones of the openings for bonding of the two kinds of structures 74 that were formed on the substrate were used in bonding the thermoelectric material wafer 70 to the substrate 72 to dispense with wrong bonding locations and to promote the mutual positioning accuracy.

In a cutting and eliminating step (D), the thermoelectric wafer 70 bonded to the substrate 72 was transformed into thermoelectric material chips 75 bonded to the substrate 72 by cutting and eliminating portions of the thermoelectric material wafer. At this instance, portions of the substrate 72 might be cut and eliminated in accordance with the necessity. In this embodiment, the cutting and eliminating step (D) was performed by using a dicing saw that was used in cutting silicon semiconductors and the like. A blade having the thickness of 100 μm was used in the cutting and eliminating step. The thickness of the blade was selected under conditions in which the length of a side of a square of the thermoelectric material chip 70 in this embodiment was 50 μm, the center distance between nearest thermoelectric material chips of a same kind was 100 μm and the thermoelectric material chips of different kinds were bonded in the positional relationship in FIG. 3. The cutting and eliminating unnecessary portions of the thermoelectric material was performed at central portions between the solder bumps 71 and at the same time by adjusting the height of the blade so as not to destruct the electrodes 73 on the substrate by using a gap between the thermoelectric material wafer 70 and the substrate 72 formed by the structures 74 having the height of 40 μm. The substrate 72 substantially bonded with 51 pieces of thermoelectric material chips 75 was manufactured with respect to the thermoelectric materials of respective types by longitudinally and transversely cutting and eliminating the portions by the blade of the dicing saw.

Here, substantially 51 pieces of the thermoelectric material chips 75 were bonded to the substrate 72, in which, in case where a rectangular thermoelectric material wafer was used in the arrangement and the constitution of the thermoelectric material chips in FIG. 3 and the solder bumps in 8 rows in the longitudinal direction by 7 columns the transverse direction (56 pieces in sum) were formed, in regard of the arrangement, 51 pieces were substantially related to PN junctions. In this case, unnecessary portions of chips at outer peripheral portions were removed by the cutting and eliminating step resulting in no problem if no bonding measure was performed. However, the unnecessary chips might be connected to the substrates and preserved since the mechanical reinforcement and the electrical reliability could be promoted by bonding them to the substrate in preserving them. In this case, when the enhancement of the strength of the manufactured thermoelectric device was aimed, the thermoelectric device could be manufactured with no hindrance in steps if connecting pads for electrically isolated dummies are previously provided on the substrate in making the electrodes and bonded thereto as in the other bumps. Further, by short circuiting the pads to near electrodes at which unnecessary chips are bonded to the substrate, the chips could be preserved and the mechanical reinforcement and the electrical bonding reliability of the thermoelectric material chips at outermost peripheral portions could be promoted.

In an integrating step (E), two sheets of the substrates 72 respectively bonded with the thermoelectric material chips 75 of different types were opposed, the solder bumps 71 formed on the distal ends of the respective chips and the electrodes 73 formed on the substrates were positioned to locations to be bonded, the assembly was heated while being pressed to melt the solder, whereby the thermoelectric material chips 75 and the electrodes 73 of the substrate 72 were bonded by which the thermoelectric device having the PN junctions on the top and the bottom of the substrates could have been finished. Further, the positioning in bonding was performed by inserting the solder bumps 71 formed on the distal ends of the thermoelectric material chips 75 of respective types into the inside of the remaining larger ones (70 μm in diameter) among the openings for bonding of the structures 74 formed on the substrates of different types to be bonded. The larger ones of the openings for bonding of the structures 74 were selected in positioning to facilitate the positioning of the thermoelectric material chips and the substrate electrodes and to prevent the solder from oozing and in this embodiment, the effect as well as that of the smaller openings for bonding of the structure 74 in the bonding step (C) were sufficiently provided.

With respect to the final outer dimensions of the thermoelectric device manufactured as above, the thickness was approximately 1.2 mm, the size was 2 mm×2 mm in the size of the bottom substrate provided with input and output electrodes and electrically the internal resistance was 180 Ω. When lead wires were connected to the input and output electrodes of the thermoelectric device and respective properties were investigated, the following result was provided.

With regard to the power generating function based on the Seebeck effect, the open voltage between the substrates in a temperature difference 2° C. was 35 mV and an output of 30 mV −30 μA was provided when a load resister of 1 KΩ was attached to the outside and a temperature of 2° C. was given between the substrate. Further, when 49 pieces of the thermoelectric device having 51 couples of the PN junctions were connected in series and the assembly was carried in a wrist watch, the watch could be driven at room temperature of 20° C.

With respect to the function as a cooling and heat generating element based on the Peltier effect, an aluminum irradiating plate was adhered to the substrate on the heat generating side of the substrate by a silicone adhesive agent having high thermal conductivity and a voltage of 2V was applied between the input electrodes, current of approximately 10 mA flowed and a phenomenon in which moisture in the air was instantaneously frozen on the surface of the substrate at the heat absorbing side was caused by which it was proved that the function of the thermoelectric device as a Peltier device was very excellent.

EMBODIMENT-4

As explanation will be given of making a small-scaled thermoelectric device having structure in which the sectional shape of a thermoelectric material chip is thick (70 μm) on the side of one substrate and thin (50 μm) on the side of the other substrate in a thermal device having structure of electrodes as in EMBODIMENT-1.

As the thermoelectric material, a sintered body of Bi-Te series material was similarly used. As substrate material, a silicon wafer having the thickness of 300 μm that was electrically insulated by thermally oxidizing its surface was used. With respect to the size of the element and the like, the height of thermoelectric material chips was 500 μm, the shape of the thermoelectric material chip at sections in parallel with the substrate was a square, the length of the side of the square at a section was 50 μm as mentioned above and that at a section proximate to one bonding portion was 70 μm. The center distance between nearest thermoelectric material chips of a same kind in FIG. 3 was 270 μm, the center distance between nearest thermoelectric material chips of different types was 270/√2=about 190 μm and a number of element couples arranged in a single element in series was 51. (The calculation of distance was performed with the size of the chip as 70 μm).

FIG. 8 illustrates views showing outline of steps for manufacturing the thermoelectric device of EMBODIMENT-4. As shown in FIG. 3, the manufacturing method is grossly classified into 6 steps. An explanation will be given thereto in due order.

In a bump forming step (A), a photoresist having the thickness of 101 μm was coated on both faces of respective thermoelectric material wafers 40 of P-type and N-type each comprising a Bi-Te series sintered body having the thickness of 500 μm. A resist layer having circular openings of which diameter of opening was 40 μm on one face, of which diameter of opening was 60 μm on the other face and the arrangement of which is in a desired pattern, was formed by exposing and developing the photoresist. Further, the desired pattern was determined based on the above dimensions such that the pattern conformed to the arrangement of the thermoelectric material chips in FIG. 3. Next, a nickel plating of 10 μm was performed firstly on the both faces of the openings by an electric plating method after cleaning them by an acid or the like by which so-called nickel bumps were formed. Next, a solder plating was performed on the nickel layer similarly by an electric plating method to form a solder layer of 30 μm. The solder plating was performed such that a ratio of tin to lead was 6:4. Next, when a rosin group flux was coated on the solder plated layer after removing the photoresist and a reflow treatment was performed at 230° C., spherical solder bumps 81 having the diameter of approximately 50 μm on one face and the diameter of 70 μm on the other face could be formed on the both faces of the thermoelectric material wafer 80.

Figure 9A:
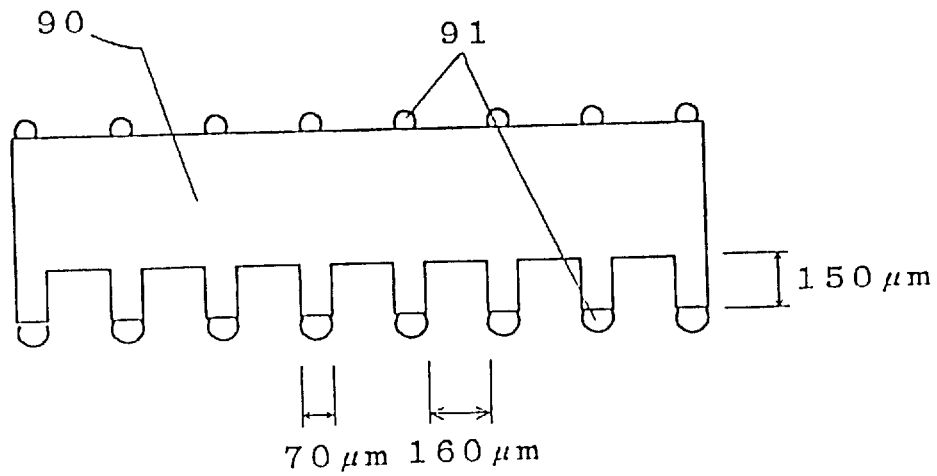
FIGS. 9A–B illustrate views showing sections of the thermoelectric material wafer after a grooving step among steps of manufacturing the thermoelectric device according to EMBODIMENT-4 of the present invention.
Figure 9B:
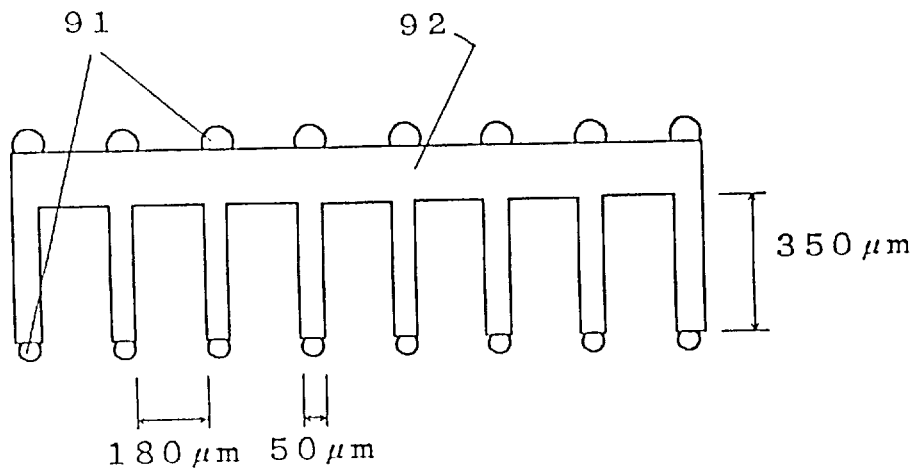

In a grooving step (B), different grooving operations were performed on the P-type thermoelectric material wafer and the N-type thermoelectric material wafer. FIG. 9 illustrates views showing the width and the depth of the grooving in the grooving step of this embodiment. As shown in FIG. 9, firstly, grooving of the depth of 150 μm was longitudinally and transversely performed at central portions between the solder bumps by a dicing saw attached with a blade having the blade width of 160 μm on surfaces on which the solder bumps having the diameter of 70 μm were formed with respect to the P-type thermoelectric material wafer. Thereby, grooves having the width of 160 μm and the depth of 150 μm could be formed and therefore, the P-type thermoelectric material wafer in which the solder bumps having the diameter of approximately 70 μm were formed on protrusions having the length of a side of 70 μm and the height from the bottom of the groove of 150 μm could be formed. Grooving of the depth of 350 μm was performed longitudinally and transversely at central portions between the bumps by a dicing saw attached with a blade having the blade width of 180 μm on surfaces on which the solder bumps having the diameter of 50 μm were formed with respect to the N-type thermoelectric material wafer. Thereby, grooves having the width of 180 μm and the depth of 350 μm could be formed and therefore, the N-type thermoelectric material wafer in which the solder bumps having the diameter of approximately 50 μm were formed on protrusions having the length of a side of 50 μm and the depth from the bottom of the groove of 350 μm could be formed. The reason of the grooving formed in such a way was that in addition to forming a gap between the thermoelectric material wafer and the substrate that is necessary in a bonding step (D) and in a cutting and eliminating step (E) in FIG. 8 that are later steps, by changing the sectional shape of the thermoelectric material chip in direction orthogonal to the substrates, in case where the manufactured thermoelectric device was used as a Peltier element, Joule heat by flowing current was to be generated as much as possible on the side of a heat radiating substrate and heat flow to the side of a heat absorbing substrate was to be prevented.

In an electrode forming step (C) in FIG. 8, films of chromium, nickel and gold in this order from the substrate respectively having the thicknesses of 0.1 μm, 1 μm and 0.1 μm were formed by a sputtering method on the surface of a silicon wafer substrate 82 having the thickness of 300 μm and provided with an oxide layer of 0.5 μm on its surface by thermal oxidation. Next, electrodes 83 were formed to conform to the electrode pattern specified in FIG. 3. On one of the substrate, doughnut-shaped structures 84 having the internal diameter of 80 μm, the outer diameter of 110 μm and the height of 30 μm were formed by photolithography using a cured thick film photoresist at the surroundings of portions to be bonded by the solder bumps. On the other ones of the substrates, doughnut-shaped structures 84 having the internal diameter of 60 μm, the outer diameter of 90 μm and the height of 30 μm were formed by photolithography using a thick film photoresist at the surroundings of portions to be bonded by the solder bumps.

In a bonding step (D) in FIG. 8, the thermoelectric material wafer 80 attached with the solder bumps 81 formed by the bump forming step (A) and the substrate 82 formed with the electrodes 83 and the doughnut-shaped structure 84 in the vicinity of the bonding portions which had been made in the electrode forming step (C) were positioned at predetermined locations and thereafter, the solder was molten by which the thermoelectric material wafer 80 and the substrate 82 were bonded. In the bonding, the solder bumps on the surface of the thermoelectric material wafer 80 on which the grooving had been performed and the doughnut-shaped structures 84 on the substrate 82 were positioned at predetermined locations and heating and bonding were performed while pressing the substrate 82 from outside. The P-type thermoelectric material wafer was bonded to the substrate in which the structures having the internal diameter of 80 μm, the outer diameter of 110 μm and the height of 30 μm were formed by the solder bumps having the diameter of 70 μm which had been formed on the surface on which the grooving had been performed and the N-type thermoelectric material wafer was bonded to the substrate on which the structures having the inner diameter of 60 μm, the outer diameter of 90 μm and the height of 30 μm were formed by the solder bumps having the diameter of 50 μm formed on the surface on which the grooving had been performed.

Figure 10A:
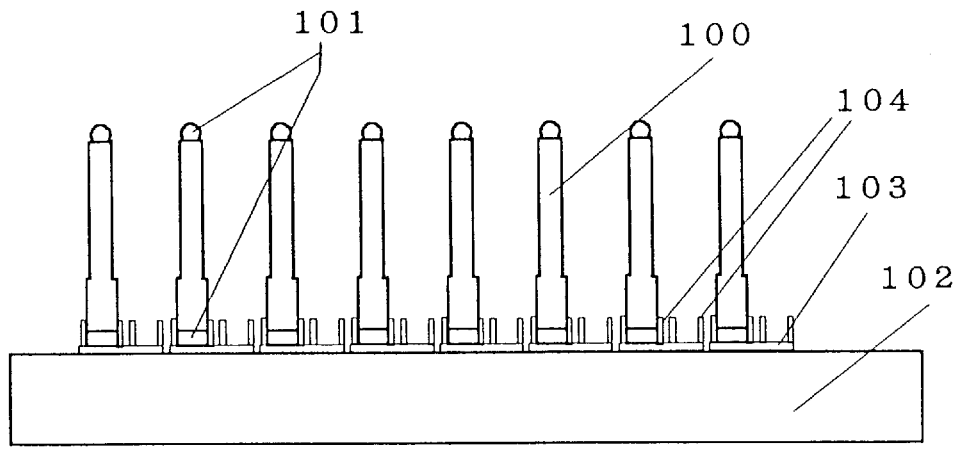
FIGS. 10A–B illustrate views showing sections of major portions after a cutting and eliminating step among steps for manufacturing the thermoelectric device according to EMBODIMENT-4 of the present invention.
Figure 10B:
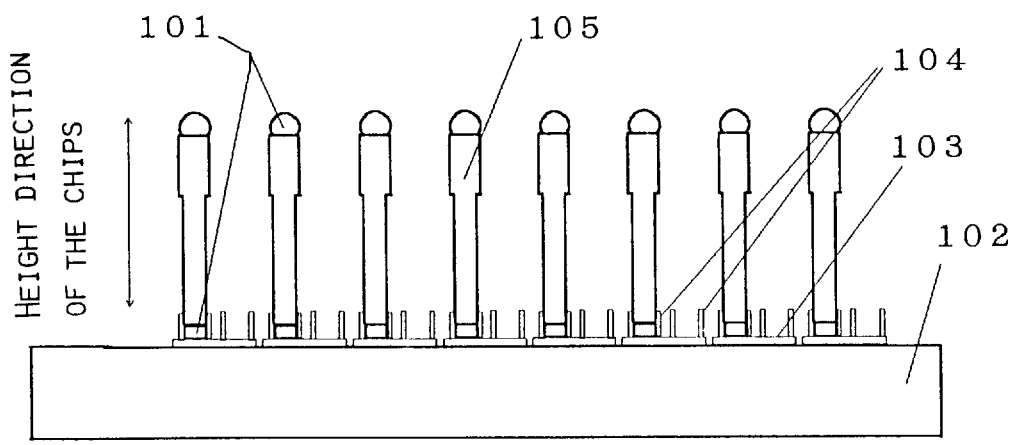

In a cutting and eliminating step (E) the thermoelectric material wafer 80 bonded to the substrate 82 was formed into thermoelectric material chips 85 bonded to the substrate 82 by cutting and eliminating portions of the thermoelectric material wafer. At this instance, portions of the substrate 82 might simultaneously be cut and eliminated in accordance with the necessity. As in EMBODIMENT-1, also in this embodiment, the cutting and eliminating step (E) was performed by using a dicing saw that was used in cutting silicon semiconductors and the like. With respect to a blade used in the cutting and eliminating step, a blade having the blade thickness of 180 $\mu$m was used in cutting and eliminating portions of the P-type thermoelectric material wafer and a blade having the blade thickness of 160 $\mu$m was used in cutting and eliminating portions of the N-type thermoelectric material wafer. In the P-type thermoelectric material wafer, the grooves having the width of 160 $\mu$m had been cut by 150 $\mu$m from the side of the substrate in the grooving step and therefore, in the cutting and eliminating step (E), the cutting and eliminating was performed by a blade having the blade thickness of 180 $\mu$m and up to the depth of 350 $\mu$m from the surface of the remaining portion of the thermoelectric material wafer on the opposite side thereof wherein the grooves having the width of 160 $\mu$m and the depth of 150 $\mu$m had been cut. In the N-type thermoelectric material wafer, the grooves having the width of 180 $\mu$m had already been cut by 350 $\mu$m from the side of the substrate in the grooving step and therefore, in the cutting and eliminating step (E), the cutting and eliminating was performed by the blade of 160 $\mu$m from the surface of the remaining portion of thermoelectric material wafer having the thickness of 150 $\mu$m on the opposite side hereof wherein the grooves having the width of 180 $\mu$m and the depth of 350 $\mu$m had been cut. FIG. 10 illustrates sectional views of the substrates to which the thermoelectric material chips made by this operation had been bonded in a direction orthogonal to the substrates. As shown in FIG. 10, in the P-type thermoelectric material chip, the size of a side is 70 $\mu$m up to 150 $\mu$m from the substrate and the size is 50 $\mu$m for the remaining portion of 150 $\mu$m to 500 $\mu$m therefrom and in the N-type thermoelectric material chip, the size is 50 $\mu$m up to 350 $\mu$m from the substrate and the size is 70 $\mu$m for the remaining portion of 350 $\mu$m to 500 $\mu$m therefrom.

In an integrating step (F) in FIG. 8, two sheets of the substrates 82 respectively bonded with the thermoelectric material chips 85 of different types were opposed, the solder bumps 81 formed on the distal ends of the respective chips and the electrodes 83 formed on the substrates were positioned at locations to be bonded and the assembly was heated while being pressed to melt the solder whereby the thermoelectric material chips 85 were bonded to the electrodes 83 on the substrates 82 by which the thermoelectric device having the PN junctions on the top and the bottom substrates could have been finished. Further, the positioning in this bonding was performed by the structures 84 formed on the substrates of different types to be bonded to the solder bumps 81 which had been formed on the distal ends of the thermoelectric material chips 85 of respective types.

Figure 11:
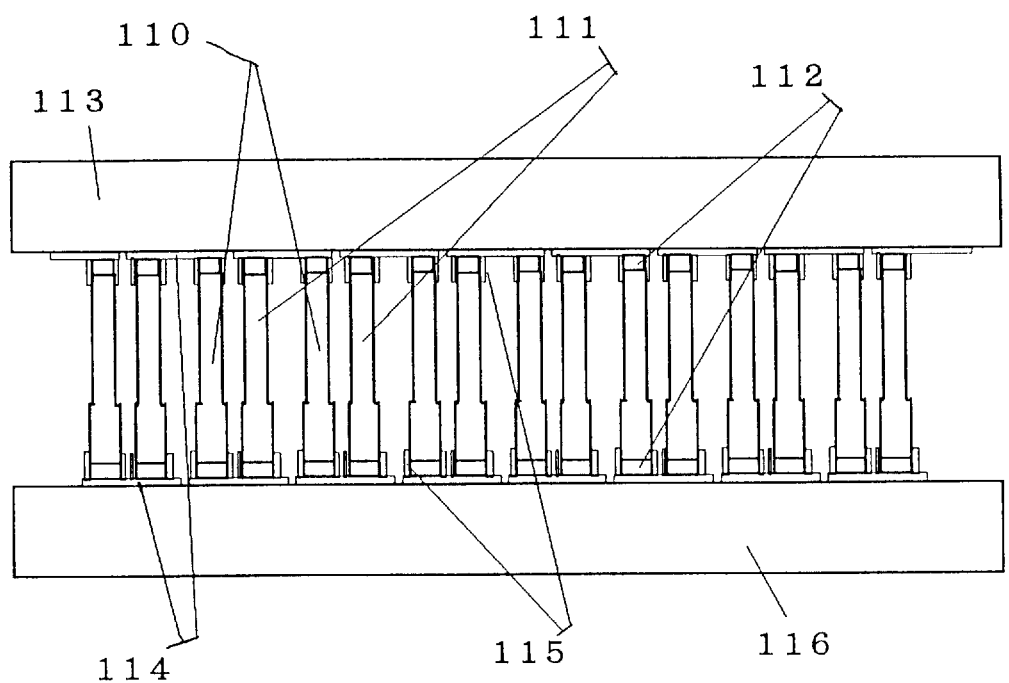
FIG. 11 is a view showing a finished section of the thermoelectric device according to EMBODIMENT-4 of the present invention.

FIG. 11 is a view indicating outline of the thermoelectric device made by the series of step. Although the constitution of the device is similar to the device manufactured in EMBODIMENT-1, the sectional shapes of the P-type thermoelectric material chip 110 and the N-type thermoelectric material chip 111 are not in a single rectangular form and those in both of the P-type and the N-type are thick on the side of one substrate 116 and thin on the side of the other substrate 113.

To investigate the function of the thermoelectric device of EMBODIMENT-4, thermoelectric devices respectively having sizes of thermoelectric material chips of 50 $\mu$m and 70 $\mu$m and having the same number of PN junctions and the outer dimensions were manufactured and the function as a Peltier element was compared among the three devices. Then, the device of this embodiment indicated a value of the COP (coefficient of Performance) superior to those of the respective comparison samples by approximately 10% showing the most excellent function.

In a Peltier device, Joule heat is generated by flowing current in addition to heat generation on the side of a radiating substrate caused by the transfer of heat by the Peltier effect. As is well known, in the Joule heat generation, in case where the section of a substance in which current flows is uniform, a central portion thereof is mostly heated and generates heat. In the thermoelectric device of this embodiment, by making current flow such that the substrate having the thinner thermoelectric material chips became a heat radiating substrate, the Joule heat generation was caused centering on the portions in which the thermoelectric material chips are thinned. Therefore, the generated heat was smoothly transferred from a nearer substrate, that is, the heat radiating substrate and accordingly, heat could be prevented from flowing to a heat absorbing substrate on the opposite side by which the thermoelectric device was provided with high function.

Figure 12:
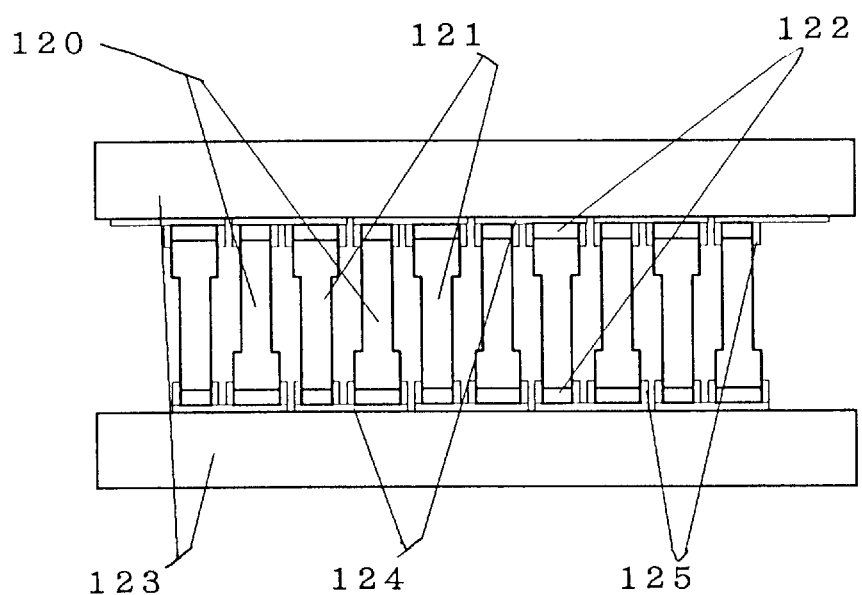
FIG. 12 is a sectional view of a thermoelectric device having the structure related to the thermoelectric device of EMBODIMENT-4 of the present invention.
Figure 13A:
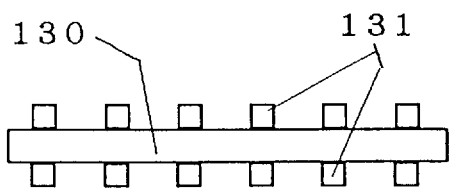
FIGS. 13A–E illustrate views showing outline of steps of manufacturing a thermoelectric device according to EMBODIMENT-5 of the present invention.
Figure 13B:
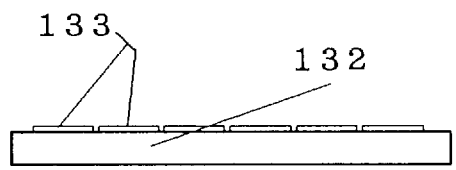
Figure 13C:
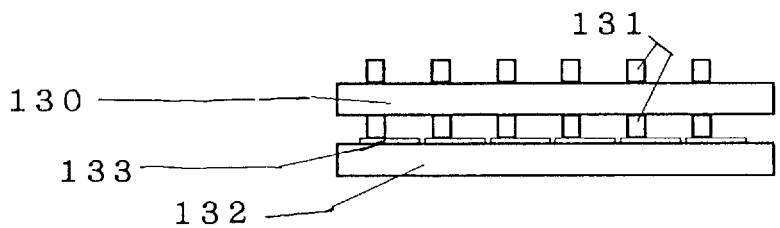
Figure 13D:
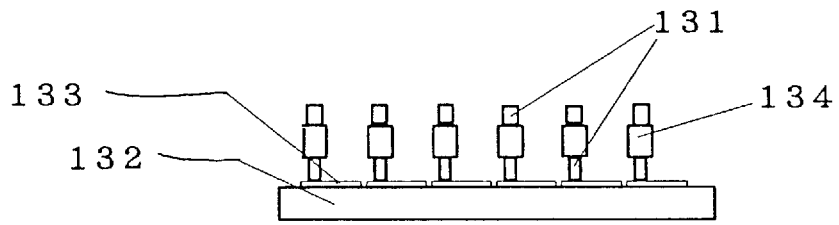
Figure 13E:
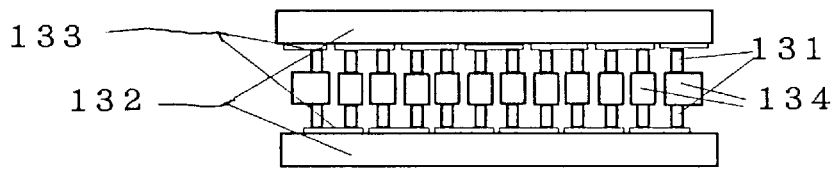

Further, although the sectional view showing of the outline of the thermoelectric device in EMBODIMENT-4 is illustrated in FIG. 11, considering the easiness of manufacturing a thermoelectric device, especially the positioning or the bonding of the thermoelectric material chips to the substrate in the integrating step, a sectional shape shown in FIG. 12 is also effective.

EMBODIMENT-5

An explanation will given of an embodiment of manufacturing a small-scaled thermoelectric device in which thermoelectric material and substrates are bonded by a method other than the solder bump method in a thermoelectric device having an electrode pattern similar to that in EMBODIMENT-1. The size of thermoelectric material chips, a number of couples of PN junctions, used material and the like are the same as those in EMBODIMENT-1.

FIG. 13 illustrates views showing outline of steps for manufacturing a thermoelectric device of this embodiment. As shown in FIG. 13, the manufacturing method is grossly classified into five steps. An explanation will be given thereto in due order.

In a protruded electrode forming step (A), a photoresist having the thickness of 50 $\mu$m was coated on both faces of respective thermoelectric material wafers 130 of P-type and N-type each comprising a Bi-Te series sintered body having the thickness of 500 $\mu$m. A resist layer having circular openings of which diameter of opening was 90 $\mu$m and the arrangement of which was in a desired pattern was formed by exposing and developing the photoresist. The desired pattern was determined based on the above-mentioned dimensions such that it became the arrangement of thermoelectric material chips specified in FIG. 3. Next, a nickel plating of 50 $\mu$m was performed on the openings by an electric plating method after cleaning them with an acid or the like thereby forming a protruded nickel layer. Next, a gold plating was performed on the nickel layer similarly by an electric plating method thereby forming a gold layer of 1 $\mu$m. Next, the protruded electrodes 131 comprising nickel-gold was formed by removing the resist. Here, the gold layer was provided to prevent the surface of nickel from being oxidized and to facilitate soldering in a later step and therefore, the gold layer was not always necessary if there was no concern of oxidation.

In an electrode forming step (B), films of chromium, nickel and gold in this order from the side of a substrate respectively having the thicknesses of 0.1 μm, 3 μm and 1 μm were formed by a sputtering method on a silicon wafer substrate 132 having the thickness of 300 μm on the surface of which an oxide layer of 0.5 μm had been provided by thermal oxidation. Next, electrodes 133 were formed on each of top and bottom substrates by photolithography to form the electrode pattern specified in FIG. 3 and a solder paste was printed on the electrodes 133 thereby finishing the electrode wirings 133.

In a bonding step (C), the thermoelectric material wafer 130 having the protruded electrodes 131 formed in the protruded electrode forming step (A) and the substrate 132 on which the electrodes 133 had been formed in the electrode forming step (B), were positioned at predetermined locations and solder was molten whereby the thermoelectric material wafer 130 and the substrate 132 were bonded. (Incidentally, the terms top or bottom have been provided for convenience of expression only as mentioned above and there is no top or bottom in the substrates of this thermoelectric device).

In a cutting and eliminating step (D), the thermoelectric material wafer 130 bonded to the substrate 132 was formed into thermoelectric material chips 134 bonded to the substrate 132 by cutting and eliminating portions of the thermoelectric material wafer 130. At this instance, portions of the substrate 132 might simultaneously be cut and eliminated in accordance with the necessity. In this embodiment, the cutting and eliminating step (D) was performed by using a dicing saw used in cutting silicon semiconductors and the like. A blade used in the cutting and eliminating had the thickness of 200 μm. The thickness of the blade was selected under conditions in which the length of a side of the square thermoelectric material chip 134 in this embodiment was 100 μm, the center distance of nearest thermoelectric material chips of a same type was 300 μm and the thermoelectric material chips of different types were bonded conforming to the positional relationships specified in FIG. 3. Unnecessary portions of the thermoelectric material were cut and eliminated at central portions between the protruded electrodes 131 and the height of the blade was adjusted by using a gap between the thermoelectric material wafer 130 and the substrate 132 produced by the protruded electrodes 131 having the height of 50 μm so as not to destruct the electrodes 133 on the substrate. The substrate 132 substantially bonded with 125 pieces of the thermoelectric material chips 134 was made for respective type of the thermoelectric material by longitudinally and transversely cutting and eliminating using the blade of a dicing saw.

In an integrating step (E), two sheets of the substrates 132 respectively bonded with the thermoelectric material chips 134 of different types were opposed and the protruded electrodes 131 respectively formed on the distal ends of the chips and the electrodes 133 formed on the substrates and comprising solder layers were positioned at locations to be bonded and the assembly was heated while being pressed to melt the solder whereby the thermoelectric material chips 134 and the electrodes 133 on the substrates 132 were bonded by which the thermoelectric device having PN junctions on the top and the bottom substrates could have been finished.

With respect to the final outer dimensions of the thermoelectric device manufactured as above, the thickness was approximately 1.2 mm, the size was 4 mm×4 mm in the size of the bottom substrate having input and output electrodes, electrically the internal resistance was 120 Ω and the basic characteristics thereof were the same as those in the thermoelectric device manufactured in EMBODIMENT-1.

EMBODIMENT-6

An explanation will be given of an embodiment of manufacturing a small-scaled thermoelectric device in which thermoelectric material and substrates are bonded by the solder bump method and a method using an electrically conductive adhesive agent in a thermoelectric device having an electrode pattern similar to that in EMBODIMENT-1. The size of a thermoelectric material chip, a number of couples of PN junctions, used material and the like are the same as those in EMBODIMENT-1.

FIG. 14 illustrates views showing outline of steps in manufacturing a thermoelectric device of this embodiment. As shown in FIG. 14, the manufacturing method is grossly classified into five steps. An explanation will be given thereto in due order.

In a bump forming step (A), a photoresist having the thickness of 50 μm was coated on one face of each of thermoelectric material wafers 140 of P-type and N-type comprising a Bi-Te series sintered body having the thickness of 500 μm. A resist layer having circular openings of which diameter of opening was 90 μm and the arrangement of which was in a desired pattern was formed by exposing and developing the photoresist. The desired pattern was determined based on the above dimensions to conform to the arrangement of thermoelectric material chips specified in FIG. 3. A plating resist was coated on the other face not coated with the photoresist. Next, firstly, a nickel plating of 40 μm was coated on the openings by an electric plating method after cleaning them by an acid or the like to form so-called nickel bumps. Next, a solder plating was performed on the nickel layer similarly by an electric plating method to form a solder layer of 30 μm. In the solder plating, a ratio of tin to lead was 6:4. Next, after removing the photoresist and the plating resist, a rosin group flux was coated on the solder-plated layer and a reflow treatment was performed at 230° C. whereby spherical solder bumps 141 having the diameter of approximately 100 μm were formed on the one face of the thermoelectric material wafer 140.

In an electrode forming step (B), films of chromium, nickel and gold in this order from the side of a substrate respectively having the thicknesses of 0.1 μm, 3 μm and 1 μm were formed on the surface of a silicon wafer substrate 142 having the thickness of 300 μm the surface of which was provided with an oxide layer of 0.5 μm by thermal oxidation. Next, electrodes 143 were formed on the top and the bottom substrates by photolithography to form the same electrode pattern as in FIG. 3. Further, two kinds of doughnut-shaped structures 144 were formed at the surroundings of portions to which a P-type thermoelectric material and a N-type thermoelectric material were to be bonded through solder bumps by photolithography using a polyamide group photoresist. The structures 144 comprising the polyamide group photoresist were provided with a doughnut shape having the internal diameter of 120 μm, the outer diameter of 150 μm and the height of 30 μm at locations to which the P-type thermoelectric material chips were disposed and the internal diameter of 150 μm, the outer diameter of 170 μm and the height of 30 μm at locations to which the N-type thermoelectric material chips were disposed in one of two sheets of the substrates constituting the thermoelectric conversion element and in the other substrate, they were provided with a doughnut shape having the inner diameter of 150 μm, the outer diameter of 170 μm and the height of 30 μm at locations to which the P-type thermoelectric material chips were disposed and the internal diameter of 120 μm, the outer diameter of 150 μm and the height of 30 μm at locations to which the N-type thermoelectric material chips were disposed.

In a bonding step (C) the thermoelectric material wafer 140 and the substrate 142 in which the electrodes 143 and the doughnut-shaped structures in the vicinities of bonding portions formed in the electrode forming step (B) were opposed at predetermined locations and the solder was molten whereby the thermoelectric material wafer 140 and the substrate 142 were bonded. Further, in bonding the P-type thermoelectric material wafer and the substrate, the positioning of the thermoelectric material wafer 140 and the substrate 142 was performed by inserting the solder bumps formed on the surface of the P-type thermoelectric material wafer into the inside of the smaller doughnut-shaped structures 144 having the inner diameter of 120 μm, the outer diameter of 150 μm and the height of 30 μm formed on the substrate. Similarly, in bonding the N-type thermoelectric material wafer and the substrate, the positioning of the thermoelectric wafer 140 and the substrate 142 was performed by inserting the solder bumps formed on the surface of the N-type thermoelectric material wafer into the inside of the smaller doughnut-shaped structures 144 having the inner diameter of 120 μm, the outer diameter of 150 μm and the height of 30 μm formed on the substrate. Here, the smaller structures among the doughnut-shaped structures having two sizes formed on the substrate were used in bonding the thermoelectric material wafer 140 and the substrate 142 to dispense with wrong bonding locations and to enhance mutual positioning accuracy.

In a cutting and eliminating step (D), the thermoelectric material wafer 140 bonded to the substrate 142 were formed into thermoelectric material chips 145 bonded to the substrate 142 by cutting and eliminating portions of the thermoelectric material wafer. At this instance, portions of the substrate 142 might simultaneously be cut and eliminated in accordance with the necessity. In this embodiment, the cutting and eliminating step (D) was performed by using a dicing saw used in cutting silicon semiconductors and the like. A blade used in the cutting and eliminating step had the thickness of 200 μm. The thickness of the blade was selected under conditions in which the length of a side of the square thermoelectric material chip 145 of this embodiment was 100 μm, the center distance between nearest thermoelectric material chips of a same kind was 300 μm and the thermoelectric material chips of different kinds were bonded in the positional relationship specified in FIG. 3. Unnecessary portions of the thermoelectric material were cut and eliminated at central portions between the solder bumps 141 and at the same time the height of the blade was adjusted by utilizing a gap between the thermoelectric material wafer 140 and the substrate 142 produced by the nickel bumps having the height of 40 μm so as not to destruct the electrodes 143 on the substrate. The substrate 142 substantially bonded with 125 pieces of the thermoelectric material chips 145 was made for each type of the thermoelectric materials by longitudinally and transversely cutting and eliminating thereof by the blade of a dicing saw.

In an integrating step (E), an electrically conductive adhesive agent having silver particles and epoxy resin as major components was made adhere to distal ends of the thermoelectric material chips 14 by stamping in two sheets of the substrates respectively bonded with the thermoelectric material chips 145 of different types, they were opposed, the distal ends of the thermoelectric material chips 145 and the electrodes 143 formed on the substrates 142 were positioned at locations to be bonded and the assembly was heated while being pressed whereby the electrically conductive adhesive agent was cured and the thermoelectric material chips 145 and the electrodes 143 on the substrates 142 were bonded by which the thermoelectric device having PN junctions on the top and the bottom substrates could have been finished. Further, the bonding was performed at the insides of the remaining doughnut-shaped structures 144 and the electrically conductive adhesive agent could be prevented from oozing in bonding by using the doughnut-shaped structures 144.

With regard to the final outer dimensions of the thermoelectric device manufactured as above, the thickness was approximately 1.2 mm, the size was 4 mm×4 mm in the size of the bottom substrate having input and output electrodes, electrically the internal resistance was 120 Ω and its basic characteristics were the same as those in the thermoelectric device manufactured in EMBODIMENT-1.

In this embodiment, in the step of forming the bumps on the thermoelectric material, the plating resist was not formed on the both faces by photolithography and therefore, there was no need of coating a photoresist on the both faces and using both a face aligner and an exposure device which could simplify apparatuses and steps.

As stated above, although the explanation has been given to the present invention with respect to the embodiments, the present invention is not restricted to the above embodiments and a broad application is conceivable. For example, although the sintered body of a Bi-Te series thermoelectric material was used in the respective embodiments as thermoelectric material, the present invention is naturally not restricted to this thermoelectric material and various thermoelectric materials of Fe-Si series material, Si-Ge series material, Co-Sb series material and the like are applicable. Further, although the description has been given to small-scaled thermoelectric devices and their methods of making in the respective embodiments, according to the thermoelectric device and the method of making thereof of the present invention, the present invention is also applicable to a comparatively large thermoelectric device which is manufactured by the conventional method in which thermoelectric material chips are interposed by two sheets of substrates after they have been formed.

EMBODIMENT-7

The present invention will now be described on the basis of one embodiment thereof and with reference to the accompanying drawings.

Figure 15:
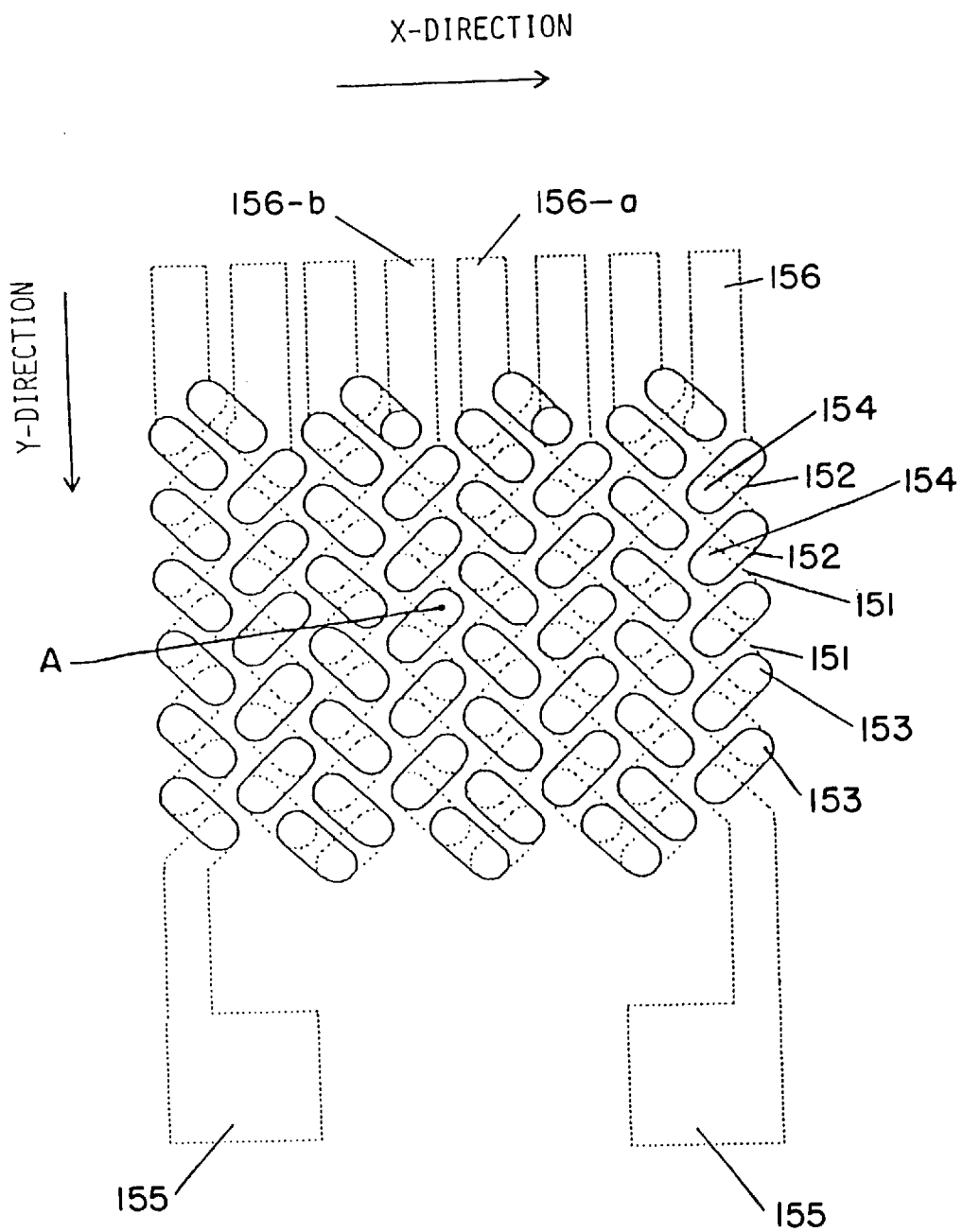
FIG. 15 is a view showing a relatioship between arrangement of thermoelectric material chips and electrodes of a thermoelectric device according to EMBODIMENT-7 of the present invention.
Figure 16A:
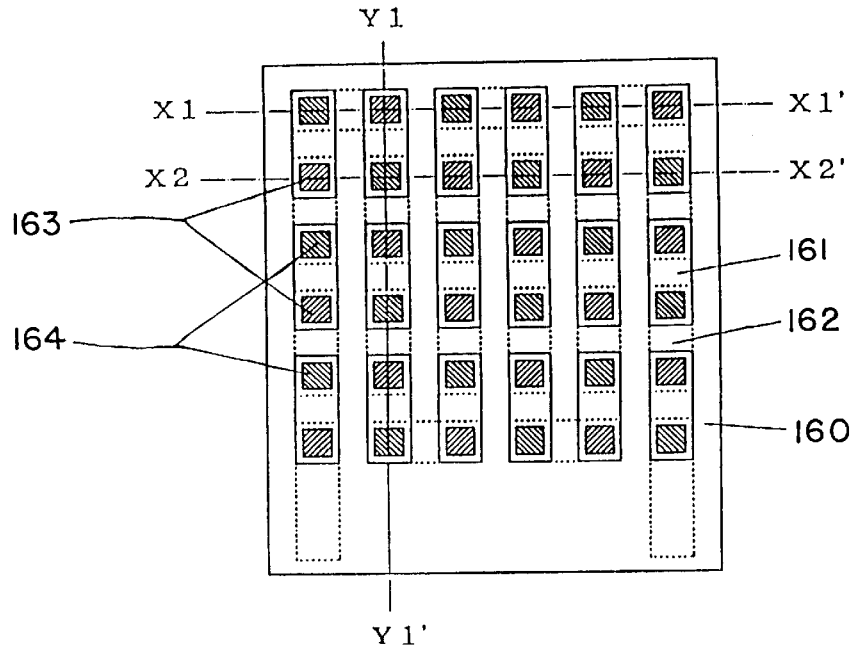
FIGS. 16A–D illustrate views showing a relationship between arrangement of thermoelectric material chips and electrodes of a conventional thermoelectric device.
Figure 16B:
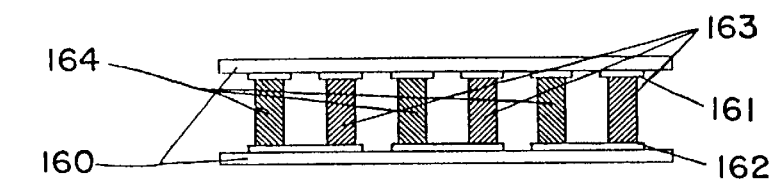
Figure 16C:
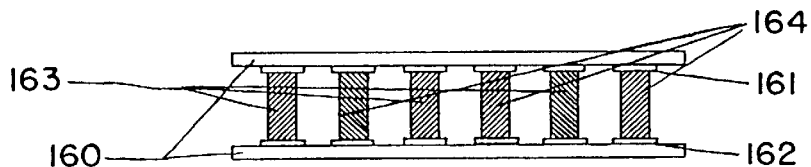
Figure 16D:
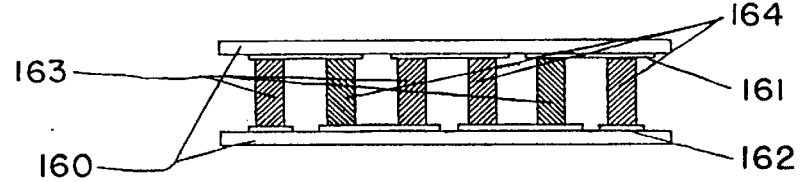
Figure 17A:
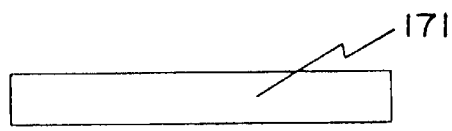
FIGS. 17A–C illustrate views showing outline of working thermoelectric material in manufacturing the conventional thermoelectric device in its longitudinal sectional view.
Figure 17B:
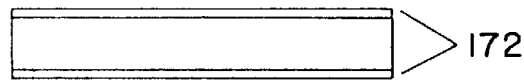
Figure 17C:
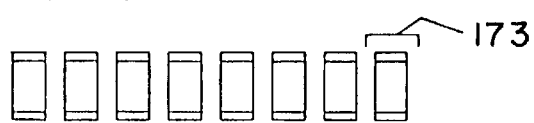
Figure 18A:
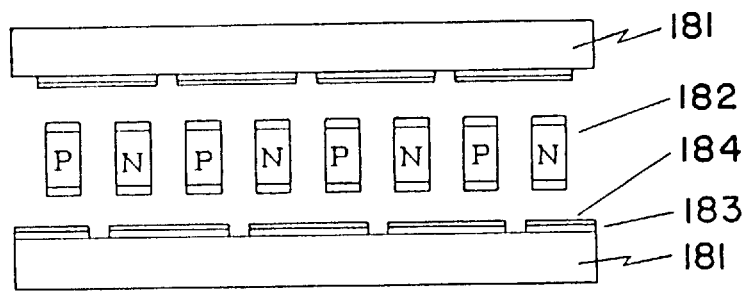
FIGS. 18A–B illustrate views showing a method of making the conventional thermoelectric device wherein the thermoelectric device is manufactured by using thermoelectric material chips and substrates provided with electrodes.
Figure 18B:
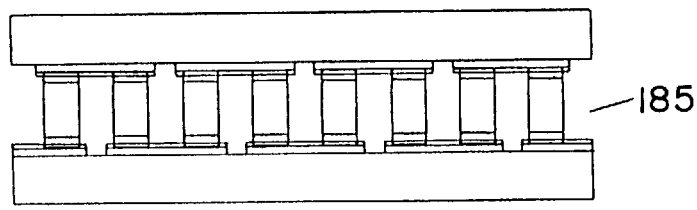

FIG. 15 is a view showing only a metal wiring part of a thermoelectric device produced by sandwiching between two alumina substrates a PN junction comprising a P-type thermoelectric material and an N-type termoelectric material connected through a metal, with the view being taken from above one of the substrates.

In FIG. 15, solid line parts 1 show an electrode pattern for the PN junctions provided on the top substrate and dashed lines 152 show electrode patterns for the PN junction provided on the bottom substrate. The P-type thermoelectric materials chips 153 and the N-type thermoelectric materials chips 154 mutually disposed at the parts where these continuous lines and dashed lines cross and are linked in series between two input/output electrodes 155 (hereinafter, between two electrodes will be refered to as between electrodes). Electrodes 156 are provided at the outer periphery of the wiring on the bottom substrate as device repair and inspection electrodes for the present invention. The existence of defects such as disconnections existing between the electrodes 156 (for example, between the electrodes 156-*a* and 156-*b* in FIG. 15) can be investigated by providing a number of electrodes 156 and by connecting with inspection probe electrodes between the electrodes. Also, if a defect exists between the electrodes 156, the defective part can be electrically isolated by making electrical connections between the electrodes and a device can be formed just using non-defective parts. For example, if there is a disconnection at the point A in FIG. 15, the device can be made to function by electrically making a short-circuit between the electrode 156-*a* and the electrode 156-*b*.

In FIG. 15, several tens thermoelectric material chips are sandwiched between the substrates but this diagram is for simplifying the explanation. The inventor carried out experiments for a heat difference power generating comprised of 50 rows in the X-direction of FIG. 15 and 10 rows in the Y-direction so that a disconnection at one place results in the elimination of tow rows (10 pairs of elements) in the X-direction, and the reduction of the power-generating performance is proportional to the ratio of the number of elements eliminated. Reductions in performance change depending on the purpose of the but with devices where the object is temperature difference power generation or refrigeration where the number of elements has been made large a reduction in the number of elements of a few to 10% is not a problem. However, this problem can be resolved by anticipating the number of defective elements beforehand and increasing the number of elements by this portion. In the case of a device having the kind of wiring structure in FIG. 15, the ratio of the number of elements which do not operate with respect to the overall number of elements upon the occurrence of defects such as discontinuities, can be made small, by adopting a wiring structure where the number of elements in the Y direction in the drawing is reduced to as great an extent as possible and the number of elements in the X direction is increased.

As explained above, according to the inventions described in embodiments, a thermoelectric material wafer and PN bonding electrodes on a substrate are bonded under a positional relationship of thermoelectric material chips and the PN bonding electrodes, the thermoelectric material chips bonded to the substrate are formed by cutting and eliminating unnecessary portions of thermoelectric material, the substrates respectively bonded with the thermoelectric material chips of different types are opposed and PN junctions are formed by bonding distal ends of the thermoelectric material chips and the PN bonding electrodes on the substrate. Therefore, there is an effect capable of manufacturing a thermoelectric device in which the size of the thermoelectric material chip is small and the density of a number of the thermoelectric material chips per unit area is high.

Further, according to the present inventions, by forming electrodes as wiring on a substrate of a thermoelectric device, inspection of the thermoelectric device can be carried out and it is possible to investigate defects such as disconnections or defective connections. Further, when defects exist, the functioning of a thermoelectric device can still be exhibited by connecting electrodes so as to exclude the defective portion. As a result of this, the device construction yield rate is markedly increased and costs are reduced.

Further, each thermoelectric device manufactured as above which is small and thin and is provided with a number of couples of PN junctions of the thermoelectric material chips, achieves a considerable effect in power generating in a small temperature difference. In EMBODIMENT-1, an example has been shown in which an electronic wrist watch was driven by using the thermoelectric devices each having couples of PN junctions of a number capable of outputting approximately 1 V or more. However, the number of devices can considerable be decreased when a step-up circuit is attached thereto or CMOS-ICs are driven at a low voltage and therefore, the thermoelectric device is applicable not only to the electronic wrist watch but to many carrying electronic instruments. Further, in using the small-scaled thermoelectric device manufactured by the present invention as a cooling device an enormous effect is provided.

For example, when the current density per thermoelectric material chip is made constant to equalize cooling function, the cooling capacity can be enhanced by increasing the voltage since the sectional area of the thermoelectric material chip can be small and many thermoelectric material chips can be arranged in series. For example, the cooling function is determined by power inputted to a thermoelectric device and in a conventional thermoelectric device, power supply causes low voltage and high current since the sectional area of a thermoelectric material chip is large. By contrast, with regard to the thermoelectric device of the present invention, power can be supplied at low current since the sectional area of the thermoelectric material chips can be reduced. Thereby, it is not necessary to make thick wirings for inputting and outputting and to provide a large current-type power source for use. Further, a multi-stage element called a cascade type can easily be manufactured since electric wirings can be made thin by which an extremely low temperature can be achieved.

Further, although the size of the thermoelectric material chip was 500 $\mu$m or less in the embodiments, with respect to the size, the present invention is naturally applicable to the size of several hundred $\mu$m to mm order that is a general size. Although the description has been given of making individual thermoelectric devices in the embodiments, it is possible to manufacture a plurality of devices in one operation by using large-scaled substrates and thermoelectric material wafers. Therefore, the present invention achieves an enormous effect in manufacturing small-scaled thermoelectric devices in view of the production cost.

What is claimed is:

1. A method of making a thermoelectric device, comprising the steps of: forming electrodes on each of two sheets of substrates; bonding a P-type thermoelectric material plate to one of the substrates; bonding an N-type thermoelectric material plate to the other of the substrates; cutting and eliminating portions of each bonded thermoelectric material plate to form separate substrates bonded with P-type and N-type thermoelectric material chips, respectively; and integrating the thermoelectric device by opposing the substrate bonded with the P-type thermoelectric material chips to the substrate bonded with the N-type thermoelectric material chips and bonding the electrodes formed on the substrates to distal ends of the thermoelectric material chips to thereby form pairs of PN-junctions.

2. A method of making a thermoelectric device according to claim 1; wherein a gap is formed between each of the substrates and a respective one of the thermoelectric material plates during the step of bonding the thermoelectric material plates to the substrates.

3. A method of making a thermoelectric device according to claim 1; including the step of forming bumps having a preselected shape and arrangement pattern and made of at least one of the materials selected from the group consisting of solder, gold, silver, copper and nickel on at least one surface of each of the thermoelectric material plates; and wherein the step of bonding the thermoelectric material plates to the substrates comprises bonding the thermoelectric material plates to the substrates through the bumps.

4. A method of making a thermoelectric device according to claim 1; wherein a gap is formed between each of the substrates and a respective one of the thermoelectric material plates during the step of bonding the thermoelectric material plates to the substrates by bumps formed on a surface of each of the thermoelectric material plates.

5. A method of making a thermoelectric device according to claim 1; wherein a gap is formed between each of the substrates and a respective one of the thermoelectric material plates during the step of bonding the thermoelectric material plates to the substrates by structures formed on the substrates.

6. A method of making a thermoelectric device according to claim 1; further comprising a step of forming bumps on a surface of each of the thermoelectric material plates other than the surface of each of the thermoelectric material plates bonded to the substrates after the step of bonding the thermoelectric material plates to the substrates.

7. A method of making a thermoelectric device according to claim 1; further comprising a step of processing the entire surface or portions of the surface of each of the thermoelectric material plates before bonding the thermoelectric material plates to the substrates to form protruding bonding portions for bonding the thermoelectric material plates to the substrates.

8. A method of making a thermoelectric device according to claim 1; further comprising a step of processing the entire surface or portions of the surface of each of the thermoelectric material plates before bonding the thermoelectric material plates to the substrates to form grooves for bonding the thermoelectric material plates to the substrates.

9. A method of making a thermoelectric device according to claim 1; further comprising a step of forming protruding portions by grooving the entire surface or portions of the surface of each of the thermoelectric material plates on which a bonding material layer is formed before the step of bonding the thermoelectric material plates to the substrates.

10. A method of making a thermoelectric device according to claim 1; further comprising the steps of forming bumps on the surface of each of the thermoelectric material plates and grooving a portion of the surface of the thermoelectric plates between the bumps before bonding the thermoelectric material plates to the substrates.

11. A method of making a thermoelectric device according to claim 1; further comprising a step of forming grooves having a first preselected width on at least one of the surfaces of each of the thermoelectric material plates before the step of bonding the thermoelectric material plates to the substrates; and wherein the cutting and eliminating step comprises cutting the portions of the thermoelectric material plates with a second preselected cutting width different from the first cutting width.

12. A method of making a thermoelectric device, comprising the steps of:
bonding a P-type thermoelectric material plate to a first substrate having electrodes;
bonding an N-type thermoelectric material plate to a second substrate having electrodes;
cutting and removing portions of each of the thermoelectric material plates to form P-type and N-type thermoelectric material chips bonded to the first and second substrates, respectively; and
bonding the N-type thermoelectric material chips of the second substrate to the electrodes of the first substrate and bonding the P-type thermoelectric material chips of the first substrate to the electrodes of the second substrate to form PN-junctions between the first and second substrates.

13. A method of making a thermoelectric device according to claim 12; wherein a gap is formed between the P-type thermoelectric material plate and the first substrate and between the N-type thermoelectric material plate and the second substrate when the P-type thermoelectric material plate and the N-type thermoelectric material plate are bonded to the first and second substrates, respectively.

14. A method of making a thermoelectric device according to claim 12; including the step of forming bumps having a preselected size and arrangement pattern on at least one surface of each of the thermoelectric material plates before bonding the thermoelectric material plates to the substrates.

15. A method of making a thermoelectric device according to claim 14; wherein the bumps are comprised of a material selected from the group consisting of solder, gold, silver, copper and nickel.

16. A method of making a thermoelectric device according to claim 14; including the step of forming connecting elements on a surface of each of the substrates before bonding the thermoelectric material plates to the substrates; and wherein the step of bonding the thermoelectric material plates to the substrates includes connecting each of the bumps of the thermoelectric material plates to one of the connecting elements of the substrates to position the thermoelectric material plates on the substrates with a gap therebetween.

17. A method of making a thermoelectric device according to claim 14; including the step of grooving a portion of the surface of each of the thermoelectric material plates between the bumps before bonding the thermoelectric material plates to the substrates.

18. A method of making a thermoelectric device according to claim 12; including the step of forming grooves on at least one surface of each of the thermoelectric material plates before bonding the thermoelectric material plates to the substrates.

19. A method of making a thermoelectric device, comprising the steps of:
forming electrodes on a surface of a first substrate and on a surface of a second substrate;
disposing a P-type thermoelectric material plate and an N-type thermoelectric material plate on the surfaces of the first and second substrates, respectively;
processing the P-type thermoelectric material plate and the N-type thermoelectric material plate to form P-type thermoelectric material chips and N-type thermoelectric material chips, respectively;
disposing the first substrate over the second substrate so that the P-type thermoelectric material chips face the N-type thermoelectric material chips; and
connecting the P-type thermoelectric material chips to the electrodes of the second substrate and connecting the N-type thermoelectric material chips to the electrodes of the first substrate to form PN-junctions between the first and second substrates.

20. A method of making a thermoelectric device according to claim 19; wherein the processing step comprises cutting and removing portions of the thermoelectric material plates.

21. A method of making a thermoelectric device according to claim 19; including the step of forming bumps having a preselected size and arrangement pattern on at least one surface of each of the thermoelectric material plates before disposing the thermoelectric material plates on the substrates.

22. A method of making a thermoelectric device according to claim 21; wherein the bumps are comprised of a material selected from the group consisting of solder, gold, silver, copper and nickel.

23. A method of making a thermoelectric device according to claim 21; including the step of forming connecting elements on the surface of each of the substrates before disposing the thermoelectric material plates on the substrates; and wherein the step of disposing the thermoelectric material plates on the substrates comprises bonding each of the bumps of the thermoelectric material plates to one of the connecting elements of the substrates to position the thermoelectric material plates on the substrates with a gap therebetween.

24. A method of making a thermoelectric device according to claim 21; including the step of grooving a portion of the surface of each of the thermoelectric material plates between the bumps before disposing the thermoelectric material plates on the substrates.

25. A method of making a thermoelectric device according to claim 19; including the step of forming grooves on at least one surface of each of the thermoelectric material plates before disposing the thermoelectric material plates on the substrates.

* * * * *